(12) United States Patent
Mizuno et al.

(10) Patent No.: US 7,609,490 B2
(45) Date of Patent: Oct. 27, 2009

(54) MAGNETORESISTIVE DEVICE, THIN FILM MAGNETIC HEAD, HEAD GIMBAL ASSEMBLY, HEAD ARM ASSEMBLY, MAGNETIC DISK APPARATUS, SYNTHETIC ANTIFERROMAGNETIC MAGNETIZATION PINNED LAYER, MAGNETIC MEMORY CELL, AND CURRENT SENSOR

(75) Inventors: Tomohito Mizuno, Tokyo (JP); Daisuke Miyauchi, Tokyo (JP)

(73) Assignee: TDK Corporation, Tokyo (JP)

( * ) Notice: Subject to any disclaimer, the term of this patent is extended or adjusted under 35 U.S.C. 154(b) by 472 days.

(21) Appl. No.: 11/490,112

(22) Filed: Jul. 21, 2006

(65) Prior Publication Data

US 2007/0019341 A1    Jan. 25, 2007

(30) Foreign Application Priority Data

Jul. 22, 2005   (JP)   ............................. 2005-213251

(51) Int. Cl.
*G11B 5/39* (2006.01)
*G11B 5/127* (2006.01)

(52) U.S. Cl. ................................. 360/324.11

(58) Field of Classification Search ............ 360/324.11, 360/324.12, 97.01, 313, 324.2
See application file for complete search history.

(56) References Cited

U.S. PATENT DOCUMENTS

| | | | |
|---|---|---|---|
| 7,196,878 B2 * | 3/2007 | Fox et al. ............... | 360/324.11 |
| 7,312,959 B2 * | 12/2007 | Nakabayashi et al. .. | 360/324.11 |
| 7,420,770 B2 * | 9/2008 | Ho et al. .................. | 360/97.01 |
| 7,433,161 B2 * | 10/2008 | Ikarashi et al. .......... | 360/324.11 |
| 2003/0179520 A1 * | 9/2003 | Hasegawa ............... | 360/324.12 |
| 2004/0085681 A1 * | 5/2004 | Kai et al. .................... | 360/313 |
| 2004/0265636 A1 | 12/2004 | Doerner et al. | |
| 2005/0157435 A1 * | 7/2005 | Ikarashi et al. .......... | 360/324.11 |

FOREIGN PATENT DOCUMENTS

JP    A 2003-017783    1/2003
JP    A-2005-018973    1/2005

* cited by examiner

*Primary Examiner*—William J Klimowicz
(74) *Attorney, Agent, or Firm*—Oliff & Berridge, PLC

(57) ABSTRACT

An MR device includes a magnetization pinned film having a nonmagnetic intermediate layer positioned on the opposite side of a magnetization free layer while sandwiching a nonmagnetic spacer layer and made of RuCu. In the case of passing read current in the stacking direction via lower and upper electrodes, decrease in a resistance change amount caused by a second magnetization pinned layer can be suppressed. Further, a first magnetization pinned layer and the second magnetization pined layer which are thicker can be antiferromagnetically coupled to each other in magnetic fields in a wider range. Thus, both increase in the resistance change amount and magnetic field stability can be achieved. Therefore, while maintaining stable operations by reducing the influence of external noise, the invention can address higher recording density by the increase in the resistance change amount as a whole.

13 Claims, 19 Drawing Sheets

LOW RESISTANCE STATE

HIGH RESISTANCE STATE

MAGNETORESISTIVE DEVICE, THIN FILM MAGNETIC HEAD, HEAD GIMBAL ASSEMBLY, HEAD ARM ASSEMBLY, MAGNETIC DISK APPARATUS, SYNTHETIC ANTIFERROMAGNETIC MAGNETIZATION PINNED LAYER, MAGNETIC MEMORY CELL, AND CURRENT SENSOR

BACKGROUND OF THE INVENTION

1. Field of the Invention

The present invention relates to a synthetic antiferromagnetic pinned layer having a pair of ferromagnetic layers which are antiferromagnetic-coupled to each other with a nonmagnetic intermediate layer in between, a magnetoresistive device having the same, a thin film magnetic head, a head gimbals assembly, a head arm assembly, a magnetic disk apparatus, a magnetic memory cell, and a current sensor.

2. Description of the Related Art

For reading information on a magnetic recording medium such as a hard disk, a thin film magnetic head having an MR (Magneto-Resistive) device exhibiting the MR effect is widely used. In recent years, as recording density of a magnetic recording medium is becoming higher and higher, a thin film magnetic head using a giant magneto-resistive device (GMR device) exhibiting the GMR effect is commonly used. An example of the GMR device is a spin valve (SV) type GMR device.

The SV-type GMR device has an SV film obtained by stacking a magnetic layer (magnetization pinned layer) whose magnetization direction is pinned in a predetermined direction and a magnetic layer (magnetization free layer) whose magnetization direction changes according to a signal magnetic field from the outside, with a nonmagnetic intermediate layer in between. In a read operation, for example, read current flows in a stack layer in-plane direction. Such a GMR device is called, in particular, a CIP (Current in Plane)-GMR device. In this case, electric resistance (that is, voltage) changes when sense current is passed according to relative angles of the magnetization directions in the two magnetic layers (the magnetization pinned layer and the magnetization free layer) of the SV film.

Recently, a thin film magnetic head having a CPP (Current Perpendicular to the Plane)—GMR element constructed so that read current flows in a stacking direction of the SV film is being developed to address further improvement in recording density. Such a CPP-GMR element has, generally, the SV film, a pair of magnetic domain control films disposed so as to face each other while sandwiching the SV film in a direction corresponding to a read track width direction via an insulating film, and upper and lower electrodes formed so as to sandwich the SV film and the pair of magnetic domain control films in a stacking direction. The upper and lower electrodes also serve as upper and lower shield films. The CPP-GMR element having such a configuration has an advantage such that, in the case of reducing the dimension in the direction of the read track width, a higher output can be obtained as compared with a CIP-GMR element. Concretely, in the CIP-GMR element, read current is passed in the in-plane direction so that, in association with reduction in the dimension in the read track width direction, a magnetosensitive part through which the read current passes becomes smaller, and a voltage change amount decreases. On the other hand, in the CPP-GMR element, read current is passed in the stacking direction, so that the influence of reduction in the dimension in the read track width direction on the voltage change amount is small. Against such a background, expectations for the CPP-GMR element as an element which can address further improvement in recording density are rising.

In particular, in the case where the magnetization pinned layer is a synthetic layer having a three-layer structure constructed by two ferromagnetic layers (first and second ferromagnetic layers) whose magnetization directions are pinned anti-parallel to each other and a nonmagnetic intermediate layer provided between the two ferromagnetic layers, even when the net moment is reduced and an external magnetic field is applied, rotation of the magnetization direction is suppressed. Moreover, exchange coupling occurs between the two ferromagnetic layers, so that the magnetization directions are stabilized. In addition, by reduction of the net moment, static magnetic field in a magnetic head decreases, and symmetry of an output waveform is improved. A synthetic CPP-GMR element having such a synthetic magnetization pinned layer can exhibit excellent performance as means for reading magnetically recorded information because of the features of the structure.

A CPP-GMR element having a synthetic magnetization pinned layer is disclosed in, for example, Japanese Patent Laid-open No. 2005-18973 that describes a magnetoresistive sensor including a stacked ferromagnetic pinned layer constructed by sandwiching an antiferromagnetic coupling film (nonmagnetic intermediate layer) made of an alloy containing ruthenium (Ru) and iron (Fe) by two ferromagnetic layers. With the configuration, strength of exchange coupling (antiferromagnetic coupling) between the two ferromagnetic layers is increased.

SUMMARY OF THE INVENTION

However, since the synthetic CPP-GMR element has a structure in which the magnetization directions of the first and second ferromagnetic layers are coupled anti-parallel to each other, the net moment is reduced and the magnetization directions are stabilized. On the other hand, since current is passed in the stacking direction to the SV film, a problem occurs such that part of the resistance change amount is lost due to the features of the structure. Specifically, a resistance change amount (voltage change amount) due to the GMR effect occurring between the first ferromagnetic layer and the magnetization pinned layer and a resistance change amount (voltage change amount) due to the GMR effect occurring between the second ferromagnetic layer whose magnetization direction is opposite to that of the first ferromagnetic layer and the magnetization free layer partially cancel each other. In the case of using the nonmagnetic intermediate layer made of an alloy containing ruthenium (Ru) and iron (Fe), the strength of antiferromagnetic coupling can be increased more than that in the case of using the nonmagnetic intermediate layer made of, for example, ruthenium only. However, further magnetic field stability is demanded to address higher recording density and higher packing density in future.

In view of the drawbacks, it is desirable to provide a magnetoresistive element stably exhibiting a larger resistance change amount and capable of addressing higher recording density, a thin film magnetic head, a head gimbals assembly, a head arm assembly, and a magnetic disk apparatus on each of which the magnetoresistive element is mounted, and a synthetic antiferromagnetic magnetization pinned layer suitably used for such a magnetoresistive element.

It is also desirable to provide a magnetic memory cell stably exhibiting a larger resistance change amount and suitable for higher integration. Further, it is also desirable to provide a current sensor capable of measuring smaller current with high precision.

A magnetoresistive device of an embodiment of the present invention includes: a magnetization free layer whose magnetization direction changes according to an external magnetic field; a nonmagnetic spacer layer which is in contact with one of faces of the magnetization free layer; a synthetic antiferromagnetic pinned layer provided on the side opposite to the magnetization free layer, of the nonmagnetic spacer layer, the synthetic antiferromagnetic pinned layer including, in order from the side of the magnetization free layer, a first magnetization pinned layer whose magnetization direction is pinned in a predetermined direction, a nonmagnetic intermediate layer made of a ruthenium copper alloy (RuCu), and a second magnetization pinned layer whose magnetization direction is pinned opposite to the magnetization direction of the first magnetization pinned layer; and a pair of electrode layers provided on both side, in a stacking direction orthogonal to a stack surface, of a lamination which is configured of the synthetic antiferromagnetic pinned layer, the nonmagnetic spacer layer and the magnetization free layer, the pair of electrode layers providing the lamination with read current in the stacking direction. A thin film magnetic head of an embodiment of the present invention includes the magnetoresistive device above mentioned. A head gimbals assembly of an embodiment of the present invention includes: a magnetic head slider having, on one side thereof, the thin film magnetic head above mentioned; and a suspension whose one end is to be provided with the magnetic head slider. A head arm assembly of an embodiment of the present invention includes the head gimbals assembly above mentioned and an arm supporting the other end of the suspension. A magnetic disk apparatus of an embodiment of the present invention has a magnetic recording medium and the head arm assembly above mentioned.

In the magnetoresistive device, the current sensor, the thin film magnetic head, the head gimbals assembly, the head arm assembly, and the magnetic disk apparatus of an embodiment of the present invention, the nonmagnetic intermediate film in the synthetic antiferromagnetic pinned layer is made of a ruthenium copper alloy. Consequently, the resistance value when current is passed in the stacking direction increases and spin scattering length is shortened as compared with the case where the nonmagnetic intermediate layer is made of ruthenium. It makes spins in the second magnetization pinned layer difficult to reach the magnetization free layer. As compared with the case where the nonmagnetic intermediate layer is made of a ruthenium iron alloy, the first and second magnetization pinned layers which are thicker can be antiferromagnetically coupled in magnetic fields in a wider range.

In the magnetoresistive device, the thin film magnetic head, the head gimbals assembly, the head arm assembly, and the magnetic disk apparatus of an embodiment of the present invention, preferably, the first magnetization pinned layer includes a first adjacent layer having a magnetic thickness of 367 kA to 1,312 kA and forming an interface with the nonmagnetic intermediate layer, the second magnetization pinned layer includes a second adjacent layer having a magnetic thickness of 230 kA to 1,175 kA and forming an interface with the nonmagnetic intermediate layer, and the nonmagnetic intermediate layer is made of a ruthenium copper alloy containing ruthenium in a range from 60 atom percent to 85 atom percent. It is also desirable that the nonmagnetic intermediate layer be made of a ruthenium copper alloy containing ruthenium in a range from 34 atom percent to 85 atom percent, and has a thickness of 0.6 nm to 1.0 nm. In any of the cases, the first and second adjacent layers are preferably made of a cobalt iron alloy containing cobalt in a range from 70 atom percent to 100 atom percent, or made of cobalt.

In the magnetoresistive device, the thin film magnetic head, the head gimbals assembly, the head arm assembly, and the magnetic disk apparatus of an embodiment of the present invention, preferably, the nonmagnetic intermediate layer has an exchange coupling constant of $0.8 \times 10^{-3}$ J/m$^2$ (0.8 erg/cm$^2$) or larger and has a thickness of 0.6 nm or more.

A synthetic antiferromagnetic pinned layer of an embodiment of the present invention has: a nonmagnetic intermediate layer made of a ruthenium copper alloy; and a pair of magnetization pinned layers sandwiching the nonmagnetic intermediate layer from a thickness direction, and having magnetization directions pinned antiparallel to each other.

In the synthetic antiferromagnetic pinned layer of an embodiment of the present invention, the nonmagnetic intermediate layer is made of a ruthenium copper alloy. Consequently, the resistance value when current is passed in the stacking direction increases and spin scattering length is shortened as compared with the case where the nonmagnetic intermediate layer is made of ruthenium. It makes spins in the second magnetization pinned layer difficult to reach the magnetization free layer. As compared with the case where the nonmagnetic intermediate layer is made of a ruthenium iron alloy, the first and second magnetization pinned layers which are thicker can be antiferromagnetically coupled in magnetic fields in a wider range.

A magnetic memory cell of an embodiment of the present invention includes: a magnetoresistive film including, in order, a magnetization free layer whose magnetization direction changes according to an external magnetic field, a nonmagnetic spacer layer, and a synthetic antiferromagnetic pinned layer; a pair of first conductive lines sandwiching the magnetoresistive film in a stacking direction orthogonal to a stack surface, and providing the magnetoresistive film with read current in the stacking direction; and a pair of second conductive lines extending orthogonal each other, a write current passing through each of the second conductive lines and generating a current magnetic field that changes the magnetization direction of the magnetization free layer. The synthetic antiferromagnetic pinned layer includes, in order from the side of the magnetization free layer, a first magnetization pinned layer whose magnetization direction is pinned in a predetermined direction, a nonmagnetic intermediate layer made of a ruthenium copper alloy, and a second magnetization pinned layer whose magnetization direction is pinned opposite to the magnetization direction of the first magnetization pinned layer.

A current sensor of an embodiment of the present invention includes: a current line to which a current to be detected is supplied; and a magnetoresistive film including, in order, a magnetization free layer whose magnetization direction changes according to a current magnetic field generated by the current to be detected which flows in the current line, a nonmagnetic spacer layer, and a synthetic antiferromagnetic pinned layer. The synthetic antiferromagnetic pinned layer includes, in order from the side of the magnetization free layer, a first magnetization pinned layer whose magnetization direction is pinned in a predetermined direction, a nonmagnetic intermediate layer made of a ruthenium copper alloy, and a second magnetization pinned layer whose magnetization direction is pinned opposite to the magnetization direction of the first magnetization pinned layer.

In the magnetic memory cell and the current sensor of an embodiment of the present invention, the nonmagnetic intermediate layer in the synthetic antiferromagnetic pinned layer is made of a ruthenium copper alloy. Consequently, the resistance value when current is passed in the stacking direction increases and spin scattering length is shortened as compared with the case where the nonmagnetic intermediate layer is made of ruthenium. It makes spins in the second magnetization pinned layer difficult to reach the magnetization free layer. As compared with the case where the nonmagnetic intermediate layer is made of a ruthenium iron alloy, the first and second magnetization pinned layers which are thicker can be antiferromagnetically coupled in magnetic fields in a wider range.

In the magnetoresistive device, the thin film magnetic head, the head gimbals assembly, the head arm assembly, the magnetic disk apparatus, the magnetic memory cell, and the current sensor of an embodiment of the present invention, the nonmagnetic intermediate layer in the synthetic antiferromagnetic pinned layer is made of a ruthenium copper alloy. As compared with the case where the nonmagnetic intermediate layer is made of ruthenium, the resistance value when current is passed in the stacking direction increases and the influence of spins in the second magnetization pinned layer on the magnetization free layer can be reduced. As a result, decrease in the resistance change amount caused by the second magnetization pinned layer can be suppressed. As compared with the case where the nonmagnetic intermediate layer is made of a ruthenium iron alloy, the first and second magnetization pinned layers which are thicker can be antiferromagnetically coupled in magnetic fields in a wider range. Thus, both increase in the resistance change amount and magnetic field stability can be achieved. Therefore, the magnetoresistive device, the thin film magnetic head, the head gimbals assembly, the head arm assembly, and the magnetic disk apparatus of an embodiment of the present invention can address higher recording density by increasing a resistance change amount as a whole while maintaining stable read operation by reducing the influence of external noise. In the magnetic memory cell of an embodiment of the present invention, while assuring stable reading/writing operations by reducing the influence of external noise, the sensitivity of the magnetoresistive film can be increased, so that it is suitable for higher integration. Further, the current sensor of the invention can measure a smaller current to be detected at high precision.

The synthetic antiferromagnetic pinned layer of an embodiment of the present invention has the nonmagnetic intermediate layer made of a ruthenium copper alloy and a pair of magnetization pinned layers sandwiching the nonmagnetic layer in the thickness direction and displaying magnetization directions pinned opposite to each other. Thus, by applying the invention to a CPP-GMR device or a magnetic tunnel junction device, a larger resistance change amount can be stably obtained.

Other and further objects, features and advantages of the invention will appear more fully from the following description.

BRIEF DESCRITION OF THE DRAWINGS

DETAILED DESCRIPTION OF THE PRFERRED EMBODIMENTS OF THE INVENTION

Figure 1:
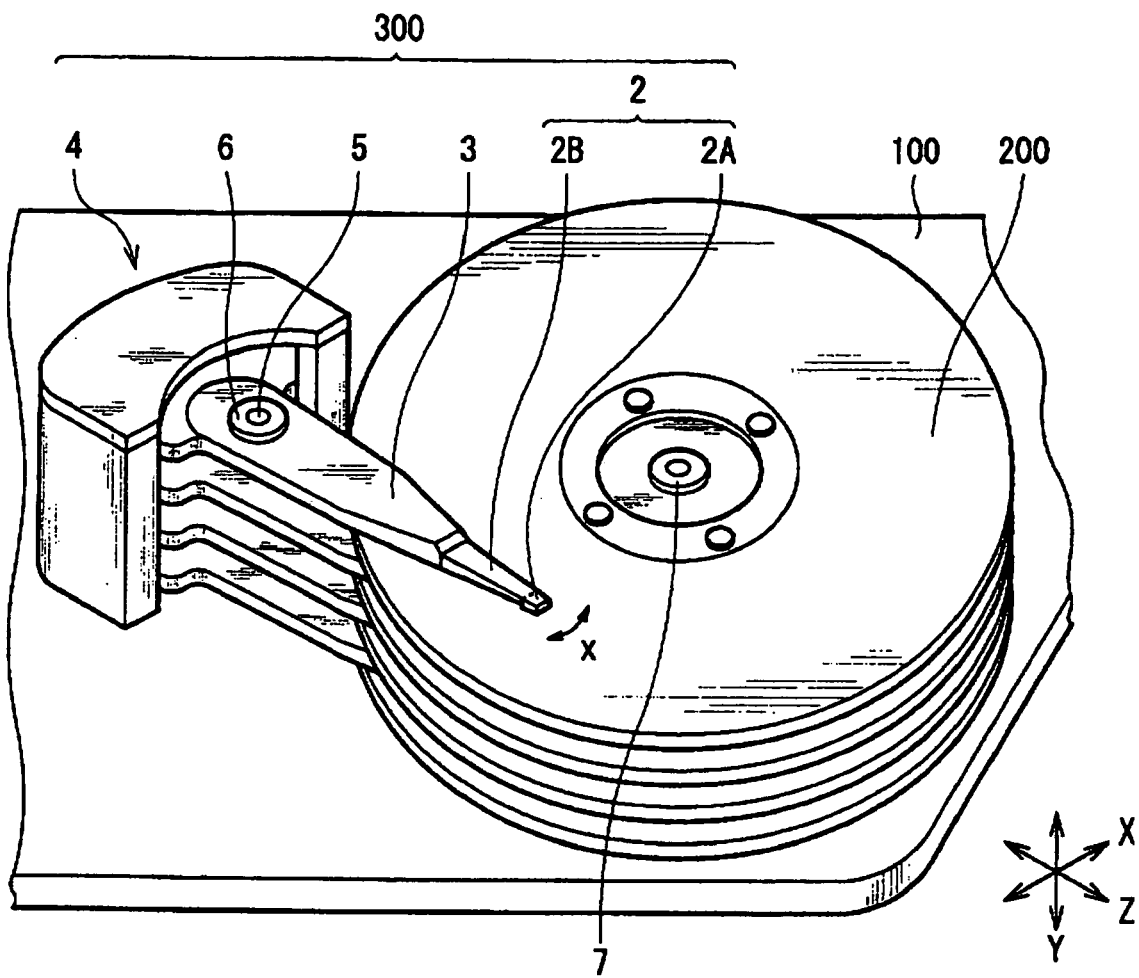
FIG. 1 is a perspective view showing a configuration of an actuator arm having a thin film magnetic head as a first embodiment of the invention.

Embodiments of the present invention will be described in detail hereinbelow by referring to the drawings.

First Embodiment

First, by referring to FIGS. 1 to 5, the configuration of a synthetic antiferromagnetic magnetization pinned layer and a magnetoresistive element, a thin film magnetic head, a head gimbals assembly, a head arm assembly, and a magnetic disk apparatus each having the synthetic antiferromagnetic magnetization pinned layer as a first embodiment of the invention will be described below.

FIG. 1 is a perspective view showing the internal configuration of the magnetic disk apparatus according to the first embodiment. The magnetic disk apparatus employs, as the driving system, a CSS (Contact-Start-Stop) operating system. As shown in FIG. 1, for example, a magnetic recording medium 200 as a magnetic recording medium on which information is to be recorded and a head arm assembly (HAA) 300 for recording/reading information to/from the magnetic recording medium 200 are provided in a casing 100. The HAA 300 has a head gimbals assembly (HGA) 2, an arm 3 for supporting the base portion of the HGA 2, and a driving unit 4 as a power source of making the arm 3 swing. The HGA 2 includes a magnetic head slider (simply called "slider" below) having a side face in which a thin film magnetic head 1 (which will be described later) of the embodiment is provided, and a suspension 2B having one end to which the slider 2A is attached. The other end (the end on the side opposite to the slider 2A) of the suspension 2B is supported by the arm 3. The arm 3 is swingable via a bearing 6 around a fixed shaft 5 fixed to the casing 100 as a center axis. The driving unit 4 is, for example, a voice coil motor or the like. Usually, the magnetic disk apparatus has a plurality of (four in FIG. 1) magnetic recording media 200 as shown in FIG. 1, and the slider 2A is disposed in correspondence with each of the recording faces (the surface and the back face) of each of the recording media 200. Each of the sliders 2A can move in a direction (X-axis direction) corresponding to the track width direction of the magnetic recording medium 200 in a plane parallel to the recording face of the magnetic recording medium 200. On the other hand, the magnetic recording medium 200 rotates around a spindle motor 7 fixed to the casing 100 as a center in a direction almost orthogonal to the X-axis direction. By the rotation of the magnetic recording medium 200 and the movement of the slider 2A, information is recorded on the magnetic recording medium 200 or recorded information is read.

Figure 2:
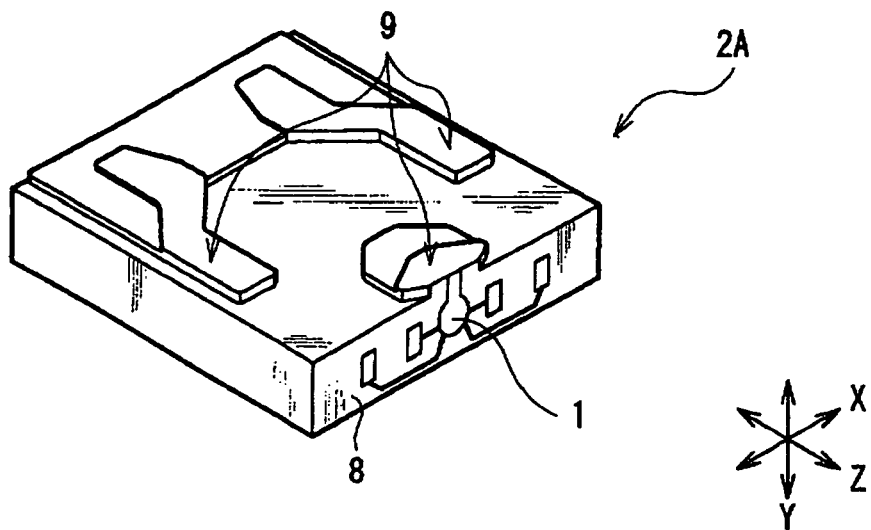
FIG. 2 is a perspective view showing a configuration of a slider in the actuator arm illustrated in FIG. 1.

FIG. 2 shows the configuration of the slider 2A illustrated in FIG. 1. The slider 2A has a base body 8 having a block shape made of, for example, altic ($Al_2O_3$.TiC). The base body 8 is formed in, for example, an almost hexahedron shape. One of the surfaces of the base body 8 is disposed so as to face close to the recording face of the magnetic recording medium 200. The surface that faces the recording face of the magnetic recording medium 200 is a recording medium facing surface (also called air bearing surface) 9. When the magnetic recording medium 200 rotates, the slider 2A floats from the recording surface along the direction (Y-axis direction) of facing the recording surface by a lift caused by air current generated between the recording surface and the recording medium facing surface 9, and a predetermined gap is created between the recording medium facing surface 9 and the magnetic recording medium 200. The thin film magnetic head 1 is provided in one side face orthogonal to the recording medium facing surface 9 of the base body 8.

Figure 3:
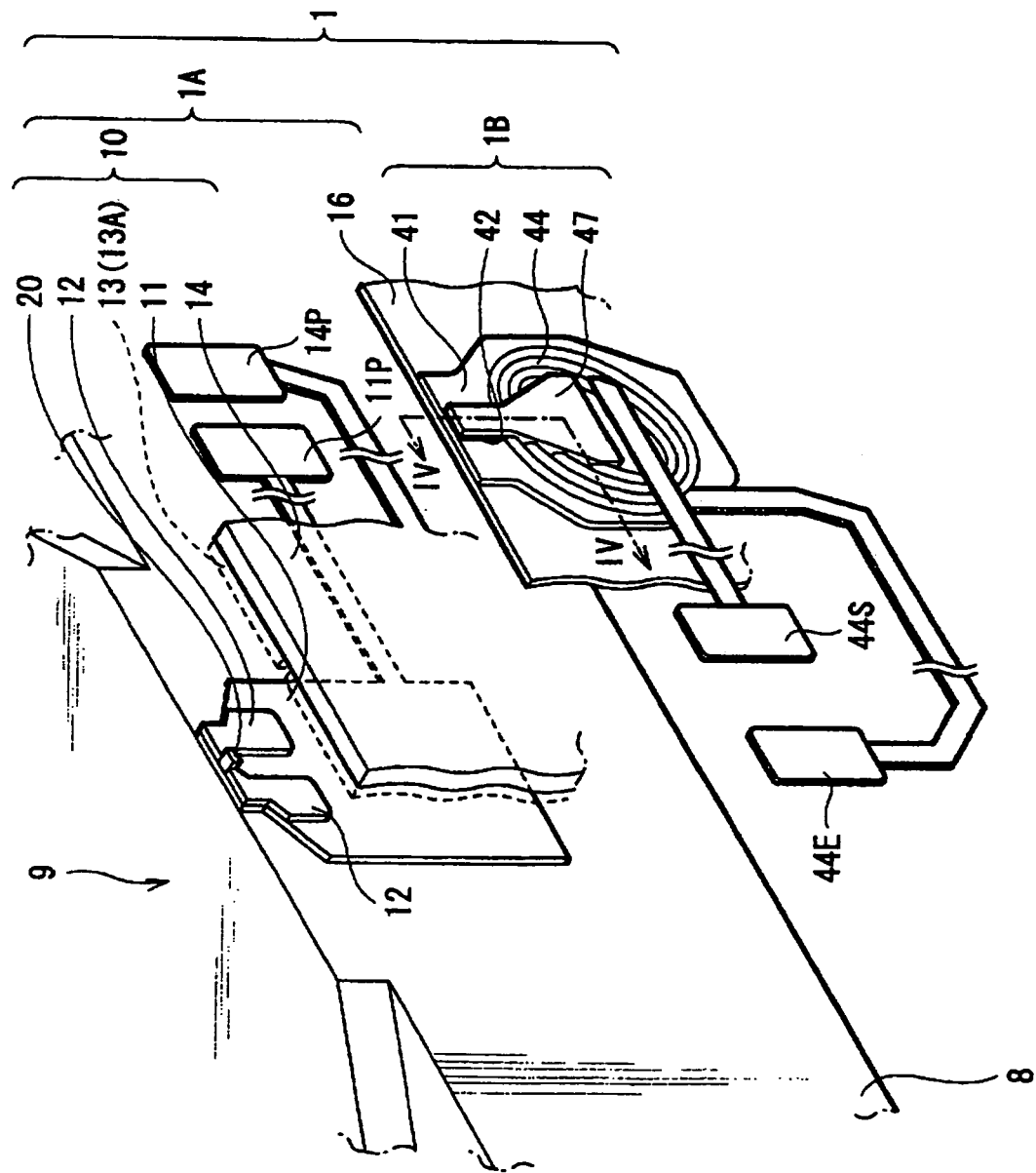
FIG. 3 is an expanded perspective view showing a configuration of the thin film magnetic head as the first embodiment of the invention.
Figure 4:
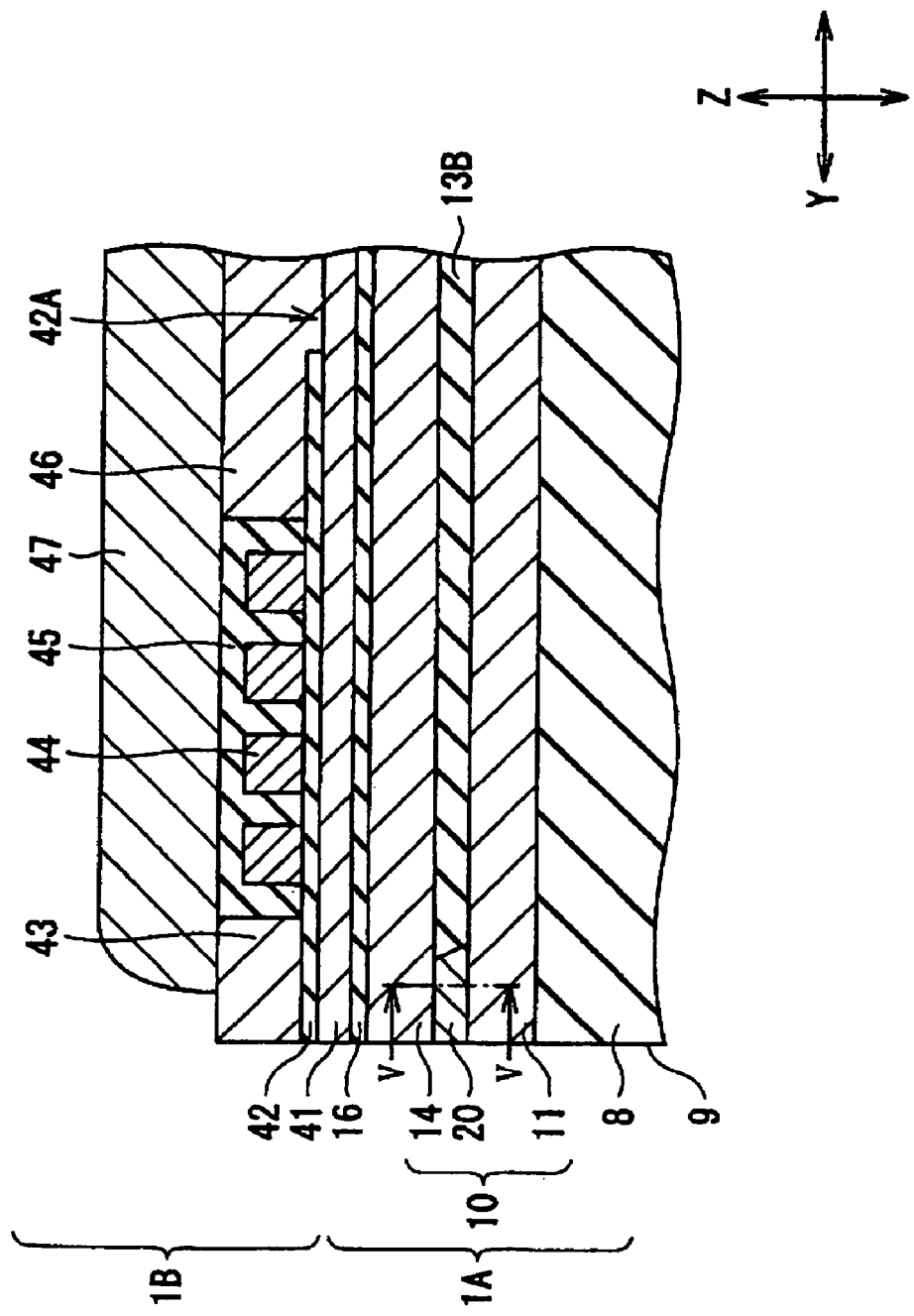
FIG. 4 is a cross section showing the structure in the arrow direction taken along line IV-IV of the thin film magnetic head illustrated in FIG. 3.

FIG. 3 is an exploded perspective view showing the configuration of the thin film magnetic head 1. FIG. 4 is a cross section showing the structure taken along line IV-IV of FIG. 3. As shown in FIGS. 3 and 4, the thin film magnetic head 1 is constructed by integrating a read head part 1A for reading magnetic information recorded on the magnetic recording medium 200 and a recording head part 1B for recording magnetic information onto recording tracks of the magnetic recording medium 200.

As shown in FIGS. 3 and 4, the read head part 1A has a magnetoresistive device (hereinbelow, called MR device) 10 having a CPP (Current Perpendicular to the Plane)—GMR (Giant Magneto-Resistive) structure constructed so that sense current flows in the stacking direction. Concretely, on a surface exposed in the recording medium facing surface 9, for example, on the base body 8, a lower electrode 11, an MR film 20, a pair of magnetic domain control films 12, an insulating film 13, and an upper electrode 14 are stacked in order. Although not shown in FIGS. 3 and 4, as will be described later, a pair of insulating films 15 is provided between the pair of magnetic domain control films 12 and the MR film 20 and between the pair of magnetic domain control films 12 and the lower electrode 11. The insulating film 13 is provided so as to surround the periphery of the MR film 20 except for the recording medium facing surface 9 in the XY plane. Specifically, the insulating film 13 is constructed by two parts; first parts 13A (refer to FIG. 3) facing each other while sandwiching the MR film 20 in the X-axis direction and a second part 13B (refer to FIG. 4) occupying an area on the side opposite to the recording medium facing surface 9 while sandwiching the MR film 20. Each of the lower electrode 11 and the upper electrode 14 has a thickness of, for example, 1 μm to 3 μm and is made of a magnetic metal material such as a nickel iron alloy (NiFe). The lower electrode 11 and the upper electrode 14 face each other while sandwiching the MR film 20 in the stacking direction (Z-axis direction) and function so that the influence of unnecessary magnetic fields is not exerted on the MR film 20. Further, the lower electrode 11 is connected to a pad 11P, and the upper electrode 14 is connected to a pad 14P. The lower electrode 11 and the upper electrode 14 also have the function as a current path for passing current to the MR film 20 in the stacking direction (Z direction). The MR film 20 has a spin valve (SV) structure in which a number of metal films including a magnetic material are stacked. The pair of magnetic domain control films 12 is disposed so as to face each other while sandwiching the MR film 20 along the direction (X-axis direction) corresponding to the track width direction of the magnetic recording medium 200. The read head part 1A having such a configuration reads recorded information by using the phenomenon that the electric resistance of the MR film 20 changes according to a signal magnetic field from the magnetic recording medium 200. The detailed configuration of the MR film 20 will be described later. Each of the insulating films 13 and 16 has a thickness of, for example, 10 nm to 100 nm and is made of an insulating material such as aluminum oxide ($Al_2O_3$) or aluminum nitride (AlN). The insulating film 13 provides mainly electric insulation between the lower and upper electrodes 11 and 14, and the insulating film 16 provides electric insulation between the read head part 1A and the recording head part 1B.

Subsequently, the configuration of the recording head part 1B will be described. As shown in FIGS. 3 and 4, the recording head part 1B is formed on the insulating layer 16 of the read head part 1A and has a lower magnetic pole 41, a recording gap layer 42, a pole tip 43, a coil 44, an insulating layer 45, a coupling part 46, and an upper magnetic pole 47.

The lower magnetic pole 41 is made of, for example, a magnetic material such as NiFe and is formed on the insulating layer 16. The recording gap layer 42 is made of an insulating material such as $Al_2O_3$ and is formed on the lower magnetic pole 41. The recording gap layer 42 has an opening 42A for forming a magnetic path in a position corresponding to the center part of the coil 44 in the XY plane. On the recording gap layer 42, the pole tip 43, the insulating layer 45, and the coupling part 46 are formed in the same plane in order from the side of the recording medium facing surface 9. The coil 44 is buried in the insulating layer 45. The coil 44 is formed on the recording gap layer 42 around the opening 42A as a center and is made of, for example, copper (Cu) or gold (Au). Both terminals of the coil 44 are connected to electrodes 44S and 44E. The upper magnetic pole 47 is made of, for example, a magnetic material such as NiFe and is formed over/on the recording gap layer 42, the pole tip 43; the insulating layer 45, and the coupling part 46 (refer to FIG. 4). The upper magnetic pole 47 is in contact with and is magnetically coupled to the lower magnetic pole 41 via the opening 42A. Although not shown, an overcoat layer made of $Al_2O_3$ or the like is formed so as to cover the whole top face of the recording head part 1B.

In the recording head part 1B having such a configuration, a magnetic flux is generated in a magnetic path constructed mainly by the lower magnetic pole 41 and the upper magnetic pole 47 by current flowing in the coil 44, and the magnetic recording medium 200 is magnetized by a signal magnetic field generated near the recording gap layer 42, thereby recording information.

Figure 5:
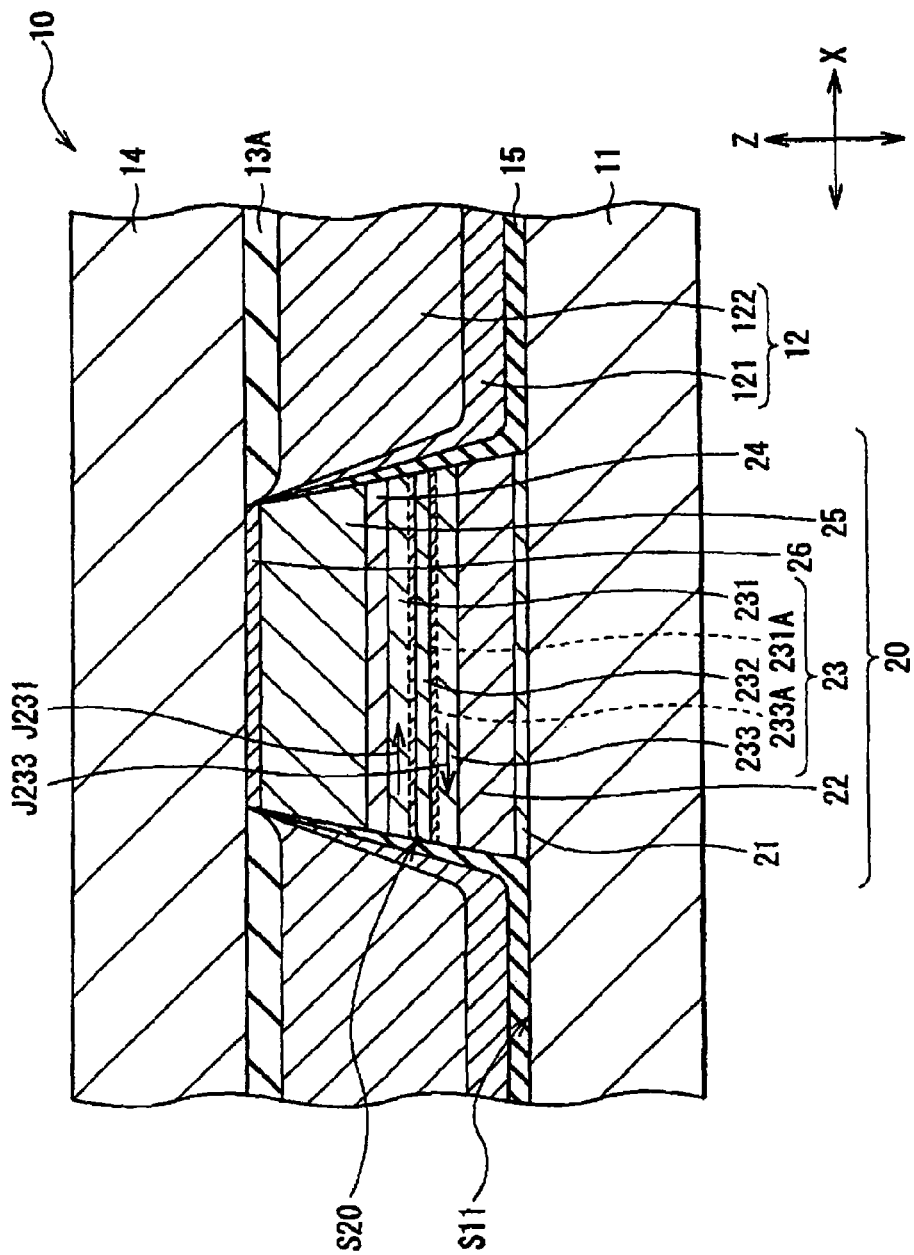
FIG. 5 is a cross section showing the configuration of a main portion viewed from the direction of the arrow V of the thin film magnetic head illustrated in FIG. 4.

Next, by referring to FIG. 5, the detailed configuration of the MR device 10 in the thin film magnetic head 1 of the embodiment will be described below. FIG. 5 is a cross section showing the structure viewed from the direction of the arrows V in FIG. 4.

As shown in FIG. 5, the MR device 10 has the MR film 20 in which, in order from the side of the lower electrode 11, a base layer 21, an antiferromagnetic layer 22, a synthetic antiferromagnetic pinned layer (hereinbelow, simply called SYAP layer) 23, a nonmagnetic spacer layer 24, a magnetization free layer 25, and a protection layer 26 are stacked. The base layer (also called a buffer layer) 21 has, for example, a stack structure in which tantalum (Ta) having a thickness of 1 nm and nickel iron chrome alloy (NiFeCr) having a thickness of 5 nm are stacked from the side of the lower electrode 11. The base layer 21 functions so that exchange coupling between the antiferromagnetic layer 22 and the SyAP layer 23 (more accurately, a second magnetization pinned layer 233 which will be described later) is performed excellently. The antiferromagnetic layer 22 is made of an antiferromagnetic material such as platinum manganese alloy (PtMn) or iridium manganese alloy (IrMn) and is formed with a thickness of, for example, 7 nm. The antiferromagnetic layer 22 functions as a so-called pinning layer for pinning the magnetization direction of the SyAp layer 23.

The SyAP layer 23 has a three-layer structure called a synthetic structure and has a first magnetization pinned layer 231, the second magnetization pinned layer 233, and a nonmagnetic intermediate layer 232 provided between the first and second magnetization pinned layers 231 and 233. More specifically, the first magnetization pinned layer 231 has a magnetization direction J231 pinned in a predetermined direction and has a thickness of, for example, 5 nm to 6 nm. The second magnetization pinned layer 233 has a magnetization direction J233 pinned in the direction opposite to the magnetization direction J231 and has a thickness of, for example, 4 nm to 5 nm. The first magnetization pinned layer 231 has a multilayer structure in which, for example, a plurality of magnetic and nonmagnetic layers including a first adjacent layer 231A serving as an interface between the first magnetization pinned layer 231 and the nonmagnetic intermediate layer 232 are stacked. The magnetic thickness in the first adjacent layer 231A lies in a range from 367 kA to 1,312 kA. The second magnetization pinned layer 233 has, for example, a multilayer structure in which a plurality of magnetic and nonmagnetic layers including a second adjacent layer 233A serving as an interface between the second magnetization pinned layer 233 and the nonmagnetic intermediate layer 232 are stacked. The magnetic thickness in the second adjacent layer 233A lies in a range from 230 kA to 1,175 kA. Each of the first and second adjacent layers 231A and 233A is made of, for example, a cobalt iron alloy whose cobalt (Co) content is equal to or higher than 70 atom percent (at %) and less than 100 atom percent (at %) (hereinbelow, expressed as $Co_xFe_{1-x}$ ($0.7 \leq X < 1.0$)) or cobalt. Preferably, the first and second adjacent layers 231A and 233A are made of CoFe in which the composition ratio between cobalt and iron is 9:1 (that is, ($Co_{90}Fe_{10}$)).

Preferably, the nonmagnetic intermediate layer 232 is formed to have a thickness of 0.4 nm to 1.0 nm by using RuCu whose ruthenium content lies in the range from 60 at % to 85 at % (that is, $Ru_xCu_{1-X}$ ($0.60 \leq X \leq 0.85$)). Alternatively, the nonmagnetic intermediate layer 232 may be formed to have a thickness of 0.6 nm to 1.0 nm by using RuCu whose ruthenium content lies in the range from 34 at % to 85 at % (that is, $Ru_xCu_{1-X}$ ($0.34 \leq X \leq 0.85$)). The nonmagnetic intermediate layer 232 may include other than ruthenium and copper, nonmagnetic metal materials such as gold (Au), silver (Ag), rhenium (Re), osmium (Os), iridium (Ir), palladium (Pd), chromium (Cr), magnesium (Mg), aluminum (Al), rhodium (Rh) and platinum (Pt). The second magnetization pinned layer 233 is formed on the side opposite to the magnetization free layer 25 with respect to the first magnetization pinned layer 231. The first and second magnetization pinned layers 231 and 233 are antiferromagnetically exchange-coupled to each other via the nonmagnetic intermediate layer 232 so that their magnetization directions J231 and J233 are pinned so as to be antiparallel to each other by the antiferromagnetic layer 22. The nonmagnetic intermediate layer 232 has an exchange coupling constant J in the range from $0.8 \times 10^{-3}$ $J/m^2$ to $2.99 \times 10^{-3}$ $J/m^2$.

The nonmagnetic spacer layer 24 is made of a nonmagnetic metal material having high electric conductivity such as copper or gold (having low electric resistance) and has a thickness of, for example, 3 nm. The nonmagnetic spacer layer 24 functions so as to mainly hinder magnetic coupling between the magnetization free layer 25 and the SyAP layer 23 (particularly, the first magnetization pinned layer 231). The read current flowing in the reading operation flows from the lower electrode 11, passes through the first magnetization pinned layer 231 and the nonmagnetic spacer layer 24, and reaches the magnetization free layer 25. Since scattering of the read current has to be minimized, it is preferable to use the above-described material having low electric resistance to form the nonmagnetic spacer layer 24.

The magnetization direction of the magnetization free layer 25 changes according to an external magnetic field. The magnetization free layer 25 is formed on the side opposite to the second magnetization pinned layer 233 with respect to the first magnetization pinned layer 231. The magnetization free layer 25 has a multilayer structure including, for example, a ferromagnetic film made of cobalt iron alloy (CoFe), nickel iron alloy (NiFe), or the like and a nonmagnetic film made of copper or the like. The thickness of the magnetization free layer 25 is, for example, 7 nm to 8 nm. The magnetization direction of the magnetization free layer 25 changes according to the direction and intensity of an external magnetic field (a signal magnetic field from the magnetic recording medium 200 in the embodiment). The magnetization free layer 25 may have a single-layer structure made of a ferromagnetic material such as a cobalt iron alloy (CoFe) or nickel iron alloy (NiFe).

The protection layer 26 has, for example, a two-layer structure in which a copper layer having a thickness of 5 nm and a ruthenium layer having a thickness of 10 nm are stacked, and functions so as to protect the MR film 20 which is formed in a manufacturing process.

The pair of magnetic domain control films 12 are constructed by a base layer 121 formed over the lower electrode 11 with the insulating film 15 in between, and a magnetic domain control layer 122 formed on the base layer 121. The magnetic domain control films 12 are disposed so as to face each other while sandwiching the MR film 20 in the X-axis direction and apply a longitudinal bias magnetic field to the magnetization free layer 25. More specifically, the base layer 121 is made of, for example, chromium titanium alloy (CrTi) or tantalum (Ta) and functions so as to improve growth of the magnetic domain control layer 122 in the manufacturing process. The magnetic domain control layer 122 is made of, for example, cobalt platinum alloy (CoPt) or the like and functions so as to maintain the single magnetic domain of the magnetization free layer 25 and suppress occurrence of Barkhausen noise. The pair of insulating film 15 is provided between the pair of magnetic domain control films 12 and the MR film 20 and between the pair of magnetic domain control films 12 and the lower electrode 11. The pair of insulating films 15 is made of, for example, a material having electrical insulation property such as $Al_2O_3$ or AlN, and is formed so as to continuously cover both end faces S20 of the MR film 20 and the top face S11 of the lower electrode 11. Consequently, electric insulation is provided between the pair of magnetic domain control films 12 and the MR film 20 and the lower electrode 11.

As shown in FIG. 5, the upper and lower electrodes 14 and 11 are disposed opposed to each other while sandwiching the MR film 20 having the above-described configuration in a direction (Z-axis direction) orthogonal to the stack face. At the time of reading magnetic information on the magnetic recording medium 200, the upper and lower electrodes 14 and 11 function as a current path for passing the read current in the Z-axis direction to the MR film 20.

Next, the read operation of the MR device 10 and the thin film magnetic head 1 constructed as described above will be described by referring to FIGS. 3 to 5.

In the thin film magnetic head 1, information recorded on the magnetic recording medium 200 is read by the read head part 1A. At the time of reading recorded information, the recording medium facing surface 9 faces the recording surface of the magnetic recording medium 200. In this state, a signal magnetic field from the magnetic recording medium 200 reaches the MR device 10. To the MR film 20, read current is passed in advance in the stacking direction (Z-axis direction) via the lower electrode 11 and the upper electrode 14. Specifically, the read current is passed in the MR film 20 in order of the base layer 21, antiferromagnetic layer 22, SyAP layer 23, nonmagnetic spacer layer 24, magnetization free layer 25, and protection layer 26 or in the reverse order. In the MR film 20, the relative direction of magnetization changes between the magnetization free layer 25 whose magnetization direction changes according to the signal magnetic field and the SyAP layer 23 whose magnetization direction is almost pinned in a predetermined direction by the antiferromagnetic layer 22 and which is not influenced by the signal magnetic field. As a result, a change occurs in spin-dependent scattering of conduction electrons and the electric resistance of the MR film 20 changes. The change in the electric resistance causes a change in output voltage. By detecting the current change, the information recorded on the magnetic recording medium 200 is read. By providing the pair of insulating films 15, leakage of the read current flowing between the lower electrode 11 and the upper electrode 14 to the pair of magnetic domain control films 12 is suppressed. That is, the read current does not expand in the X-axis direction but passes reliably while being limited in the width of the MR film 20, so that a resistance change in the read current caused by a change in the magnetization direction of the magnetization free layer 25 can be detected at higher sensitivity. Although the pair of insulating films 15 extends in the X-axis direction and covers the pair of end faces S20 of the MR film 20 and the top face S11 of the lower electrode 11 in FIG. 5, it is sufficient to cover at least the pair of end faces S20. With the configuration, the above-described effects are obtained.

The action in the MR device 10 of the embodiment will now be described.

Figure 6:
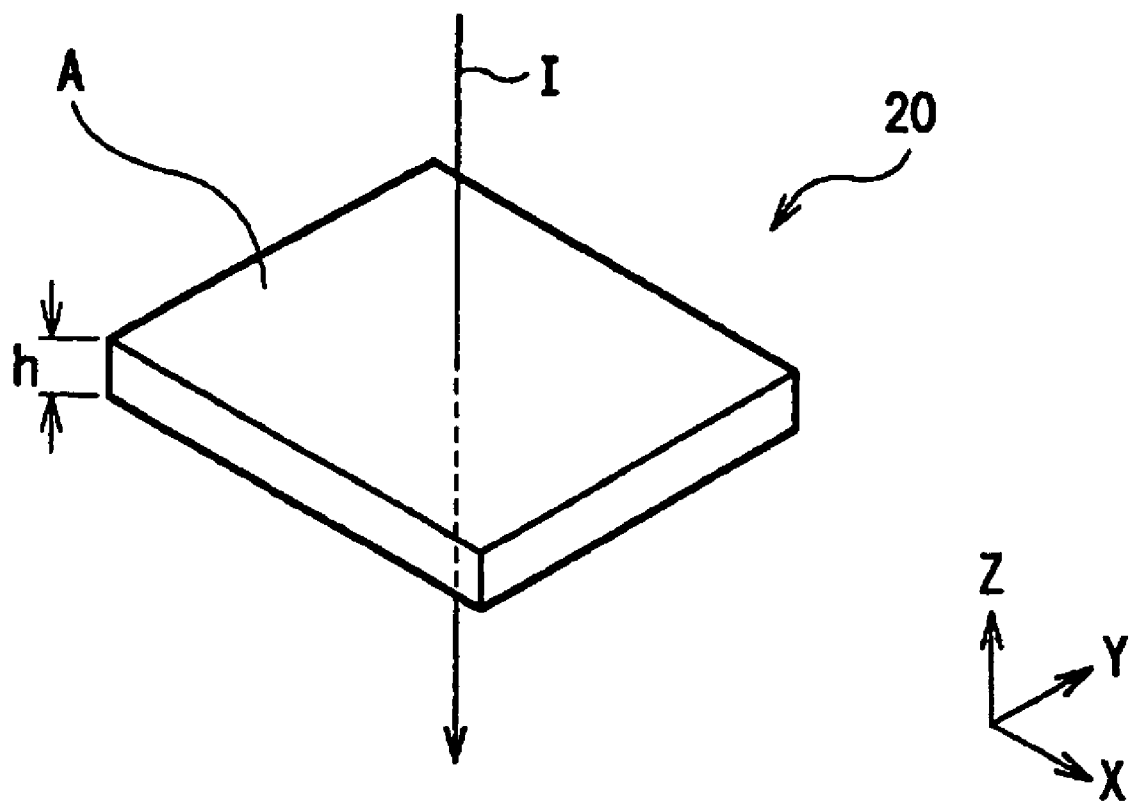
FIG. 6 is a diagram illustrating a voltage change which occurs when sense current is passed in a direction orthogonal to a stack face, to an MR device shown in FIG. 5.

The MR film 20 in the MR device 10 is constructed so that read current flows in the direction orthogonal to the stack face. It is now assumed that read current I is passed in the direction (Z-axis direction) orthogonal to the stack face of the MR film 20 having a horizontal sectional area A and a thickness h as shown in FIG. 6. A voltage change $\Delta V$ depends on the product between a resistivity change $\Delta \rho$ and the thickness h, that is, the volume of the object and is expressed as follows.

$$\Delta V = \Delta \rho \cdot h \cdot D \quad (1)$$

where D denotes current density. The equation (1) can be expressed as the equation (2) by using the horizontal sectional area A of the MR film 20 and a resistance change amount $\Delta R$ per unit area.

$$\Delta V = A \cdot \Delta R \cdot D \quad (2)$$

It is understood from the equation (2) that the voltage change $\Delta V$ is determined by a resistance change amount $A\Delta R$ of the MR film 20 as a whole.

Figure 7A:
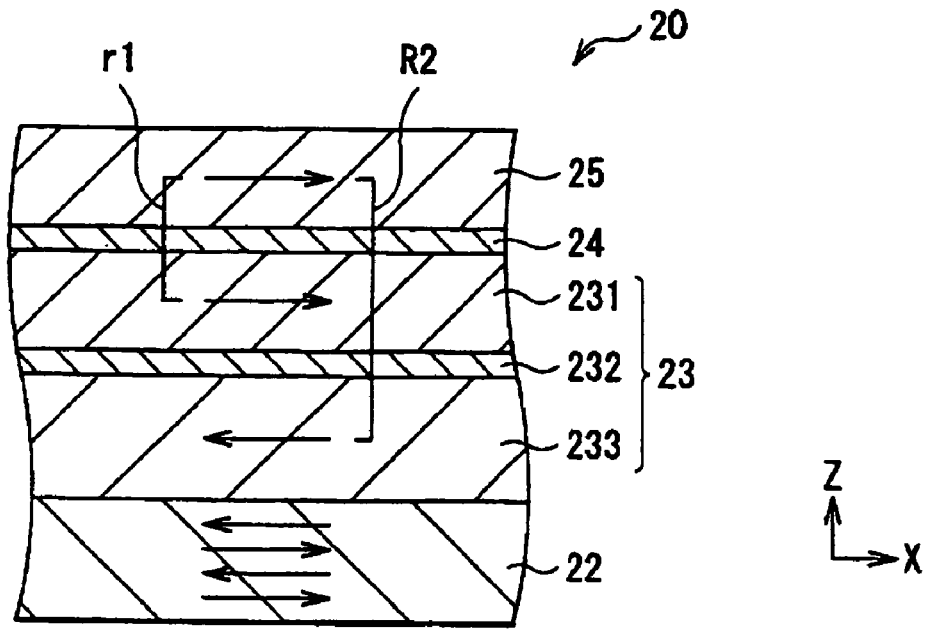
FIGS. 7A and 7B are diagrams illustrating the relation between resistance and the magnetization directions when sense current is passed in a direction orthogonal to the stack face, in the MR device shown in FIG. 5.
Figure 7B:
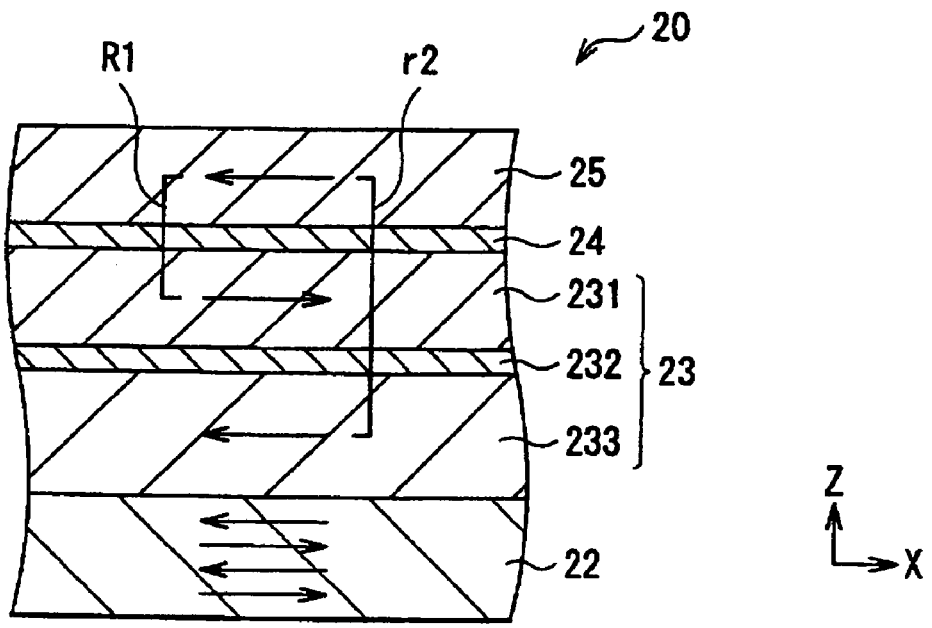

The case where the MR film 20 as a whole is in a relatively low resistance state as shown in FIG. 7A and the case where the MR film 20 as a whole is in a relatively high resistance state will be considered. The arrows in FIGS. 7A and 7B show the relative directions of magnetization of the layers. In the antiferromagnetic layer 22, magnetizations antiparallel to each other cancel out each other, so that the direction of magnetization does not appear macroscopically. Specifically, in FIG. 7A, the direction of magnetization of the magnetization free layer 25 is the +X direction and is parallel to (the same as) the direction of magnetization of the first magnetization pinned layer 231 and is antiparallel to (opposite to) the direction of magnetization of the second magnetization pinned layer 233. On the other hand, in FIG. 7B, the direction of magnetization of the magnetization free layer 25 is the −X direction and is antiparallel to the direction of magnetization of the first magnetization pinned layer 231 and is parallel to the direction of magnetization of the second magnetization pinned layer 233. The difference between the low resistance state of FIG. 7A and the high resistance state of FIG. 7B corresponds to the resistance change amount AΔR of the MR film 20.

The resistance change amount AΔR will be considered in two relations; the relation between the magnetization free layer 25 and the first magnetization pinned layer 231 and the relation between the magnetization free layer 25 and the second magnetization pinned layer 233. First, in the relation between the magnetization free layer 25 and the first magnetization pinned layer 231, the directions of magnetization are parallel to each other in FIG. 7A, so that relatively low resistance r1 is displayed. On the other hand, the directions of magnetization are antiparallel to each other in FIG. 7B, so that relatively high resistance R1 is displayed (that is, r1<R1). In contrast, in the relation between the magnetization free layer 25 and the second magnetization pinned layer 233, the directions of magnetization are antiparallel to each other in FIG. 7A, so that relatively high resistance R2 is displayed. On the other hand, the directions of magnetization are parallel to each other in FIG. 7B, so that relatively low resistance r2 is displayed (that is, R2>r2). Therefore, for example, the resistance change amount AΔR at the time of transition from the low resistance state of FIG. 7A to the high resistance state of FIG. 7B is proportional to the sum of a component resulting from the GMR effect produced between the magnetization free layer 25 and the first magnetization pinned layer 231 and a component resulting from the GMR effect produced between the magnetization free layer 25 and the second magnetization pinned layer 233, and can be expressed as follows.

$$A\Delta R \propto A(R1-r1)+A(r2-R2) \quad (3)$$

In the expression (3), the first term "A(R1−r1)" expresses a resistance change amount accompanying the GMR effect between the magnetization free layer 25 and the first magnetization pinned layer 231. The second term "A(r2−R2)" expresses a resistance change amount accompanying the GMR effect between the magnetization free layer 25 and the second magnetization pinned layer 233. Since R1>r1, the first term "A(R1−r1)" indicates a positive value. On the other hand, since R2>r2, the second term "A(r2−R2)" indicates a negative value. This results from the fact that the relation of the magnetization directions between the magnetization free layer 25 and the second magnetization pinned layer 233 and the relation of the magnetization directions between the magnetization free layer 25 and the first magnetization pinned layer 231 are always opposite to each other. Therefore, to maximally utilizing the resistance change amount "A(R1−r1)" produced between the magnetization free layer 25 and the first magnetization pinned layer 231, it is preferable to reduce the influence of the resistance change amount "A(r2−R2)" which occurs between the magnetization free layer 25 and the second magnetization pinned layer 233 as much as possible.

Since RuCu is used as the material of the nonmagnetic intermediate layer 232 in the embodiment, as compared with the case of using ruthenium which is conventionally generally used, spin scattering length Ls expressed by the following equation (4), that is, the distance in which a conduction electron can hold spin is shortened. This will be described below.

$$Ls=\{(V_F \cdot \lambda_S \cdot \tau_{SF})/3\}^{0.5} \quad (4)$$

where $V_F$ denotes Fermi velocity (motion velocity of the conduction electron), $\lambda_S$ denotes average mean free path (the scale of electric resistance), and $\tau_{SF}$ indicates spin relaxation time (the spin scattering frequency).

Figure 8:
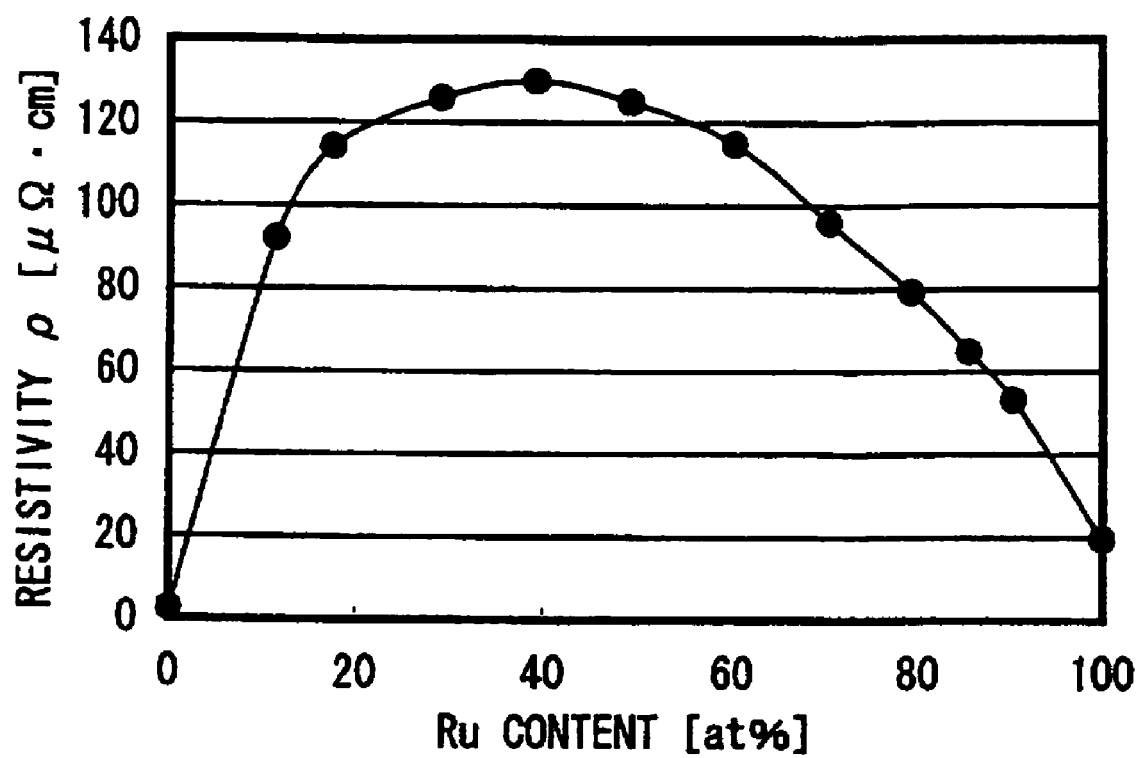
FIG. 8 is a characteristic diagram showing the relation between content of ruthenium (Ru) in RuCu and resistivity $\rho$.

First, by using RuCu, a resistance value R (of the MR film 20) when the read current I is passed increases. The increase in the resistance value R in the MR film 20 results from increase in the resistivity ρ in the nonmagnetic intermediate layer 232. As an example, the correlation between the content of ruthenium (Ru) in RuCu and the resistivity ρ is shown in FIG. 8. The horizontal axis indicates ruthenium content (atom percent (at %)) and the vertical axis indicates resistivity ρ [μΩ·cm]. In FIG. 8, when the ruthenium content is 0, the nonmagnetic intermediate layer 232 is made of only copper. When the ruthenium content is 100, the nonmagnetic intermediate layer 232 is made of only ruthenium. Therefore, basically, the resistivity in the case of using RuCu is relatively higher than that in the case of using ruthenium. In particular, when the ruthenium content is in the range from 10 at % to 90 at %, sufficiently high resistivity ρ is obtained. It is assumed that the mean free path $\lambda_S$ decreases as the resistivity ρ increases. The Fermi velocity $V_F$ can be approximated as shown by the equation (5).

$$V_F=(2E_F/m^*)^{0.5} \quad (5)$$

where $E_F$ denotes Fermi energy, and m* indicates mass of the conduction electron. Since the Fermi energy $E_F$ is proportional to the two-thirds power, by replacing the atom with a copper atom having a relatively small electron number, the Fermi velocity $V_F$ decreases more than the case of using only ruthenium. Further, irregularity of the crystal structure increases due to alloying, so that scattering of electrons increases. Therefore, the spin relaxation time $\tau_{SF}$ decreases more than the case of using only ruthenium.

As described above, by using not ruthenium but RuCu as the material of the nonmagnetic intermediate layer 232, all of the mean free path $\lambda_S$, the Fermi velocity VF, and the spin relaxation time $\tau_{SF}$ are reduced. Thus, the spin scattering length Ls is shortened.

As described above, when the spin scattering length Ls in the nonmagnetic intermediate layer 232 is shortened, information of spins of the second magnetization pinned layer 233 becomes difficult to reach the magnetization free layer 25. As a result, the influence of the amount "A(r2−R2)" of resistance change (refer to the equation (3)) which occurs between the magnetization free layer 25 and the second magnetization pinned layer 233 is reduced, and the resistance change amount AΔR as a whole in the MR film 20 can be increased.

By using RuCu as the material of the nonmagnetic intermediate layer 232, the strength of exchange coupling can be increased more than the case of using the ruthenium iron alloy (RuFe). As a result, in magnetic fields in a wider range, the first and second magnetization pinned layers which are thicker can be antiferromagnetically coupled to each other. Consequently, the thickness of a magnetic film in the first magnetization pinned layer can be increased, and both increase in the resistance change amount and stability of the magnetic fields can be achieved. Further, in the case of using $Co_XFe_{1-X}$ (0.7≦X<1.0) having the fcc (face-centered cubic) structure as the material of the first and second adjacent layers 231A and 233A sandwiching the nonmagnetic intermediate layer 232, by using RuCu having the same fcc structure as the material of the nonmagnetic intermediate layer 232, the influence of mixing of the interface is suppressed more than the case of applying RuFe having, for example, a hexagonal close-packed (hcp) structure. Therefore, the larger exchange coupling constant J can be realized more easily. In the case of using RuFe, decrease in the exchange coupling constant J due to diffusion of iron (Fe) is concerned. However, the embodiment using RuCu does not have such a problem.

By referring to FIGS. 9 to 13, a method of manufacturing the thin film magnetic head 1 will be described. The part forming the MR device 10 will be mainly described in detail.

Figure 9:
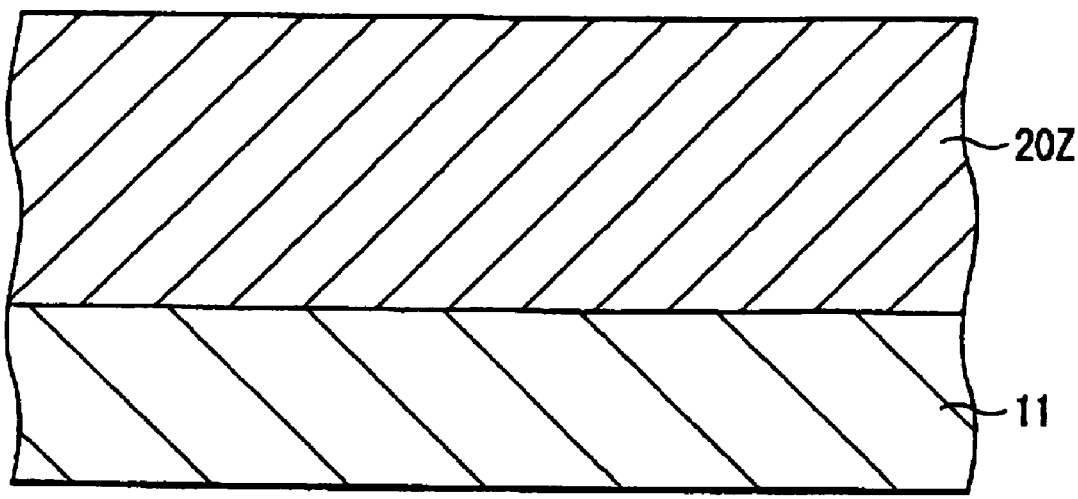
FIG. 9 is a cross section of a main part showing a process in a method of manufacturing the thin film magnetic head illustrated in FIG. 5.

In the method of manufacturing the thin film magnetic head according to the embodiment, first, as shown in FIG. 9, the lower electrode 11 is formed on one side face of the base body 8 and, after that, a multilayer film 20Z is formed on the entire surface of the lower electrode 11. Concretely, the base layer 21, antiferromagnetic layer 22, SyAP layer 23, nonmagnetic spacer layer 24, magnetization free layer 25, and protection layer 26 are stacked in order by using sputtering or the like. Further, by performing annealing process for four hours while applying magnetic fields of $10 \times (250/\pi)$ A/m at the temperature of 250° C., the magnetization direction of the SyAP layer 23 is pinned. After that, as necessary, by performing the annealing process while applying predetermined magnetic fields in the direction orthogonal to the magnetization direction of the SyAP layer 23, the initial magnetization direction of the magnetization free layer 25 is set. The multilayer film 20Z becomes the MR film 20 later. Although the internal structure of the MR film 20 and that of the multilayer film 20Z in the process of forming the MR film 20 are not shown in FIGS. 9 to 13, each of the MR film 20 and the multilayer film 20Z has the internal structure corresponding to the MR film 20 shown in FIG. 5.

Figure 10:
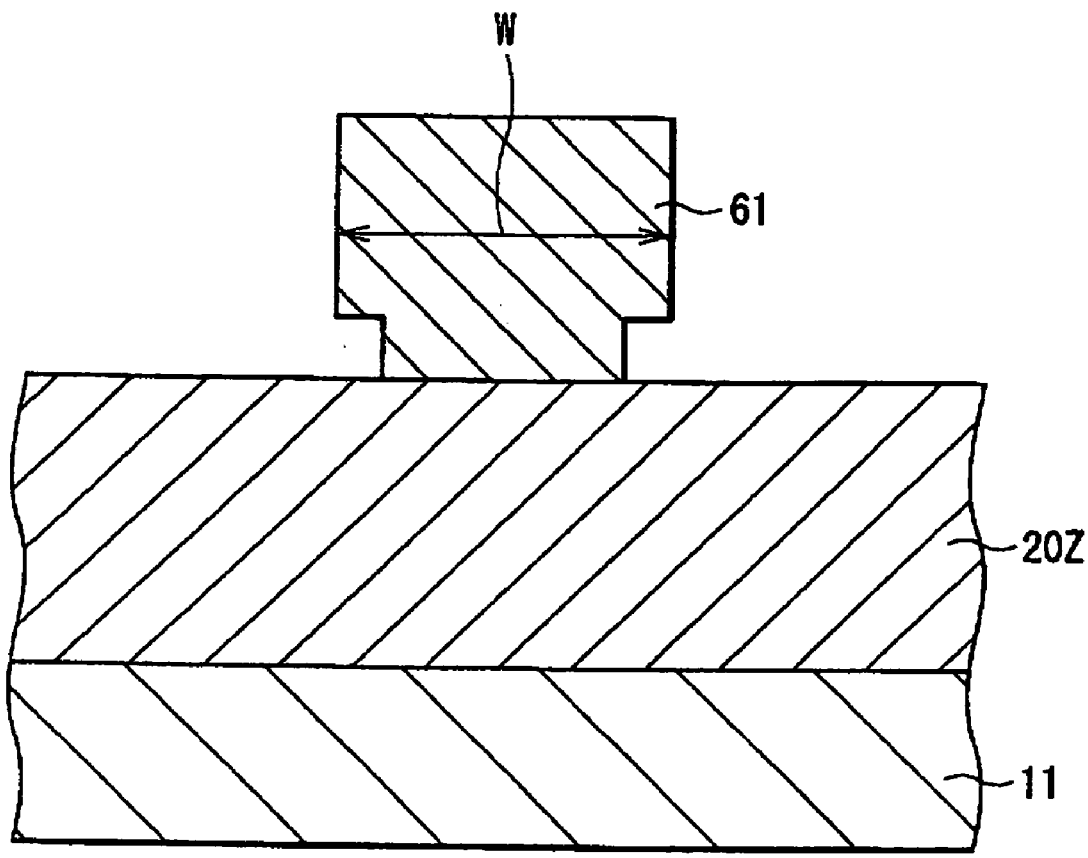
FIG. 10 is a cross section of the main part illustrating a process subsequent to FIG. 9.

Subsequently, as shown in FIG. 10, a photoresist pattern 61 is selectively formed with a width W corresponding to the part defining the device width on the multilayer film 20Z. In this case, an end of the photoresist pattern 61 may be removed by using a predetermined solvent, thereby forming an undercut.

Figure 11:
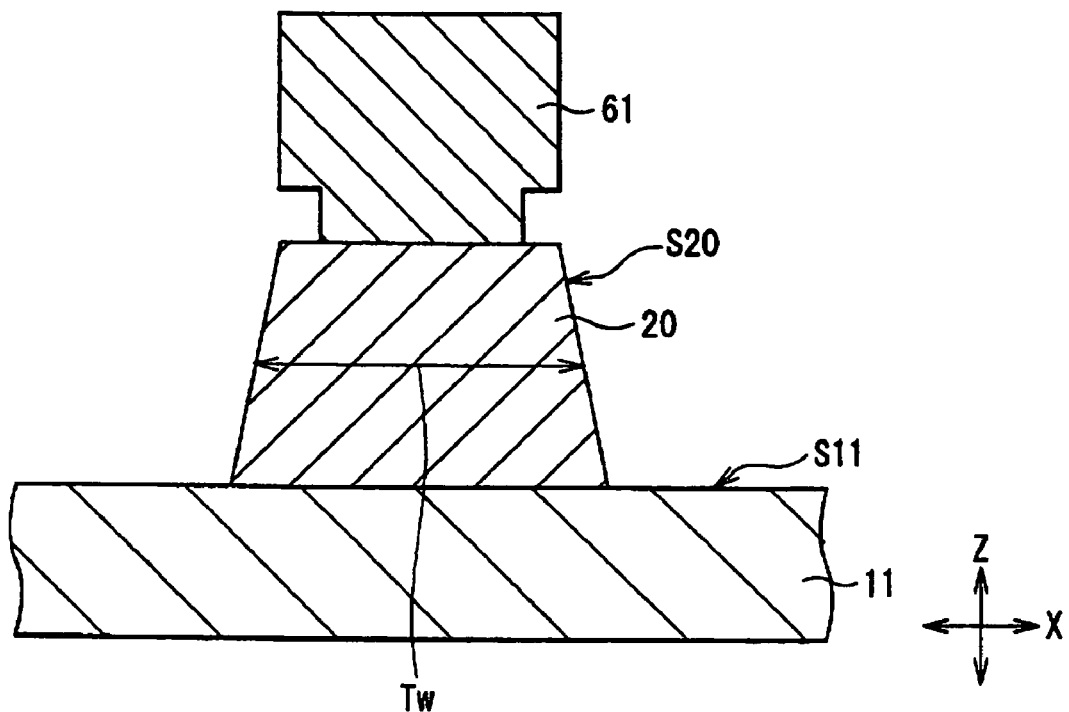
FIG. 11 is a cross section of the main part illustrating a process subsequent to FIG. 10.
Figure 12:
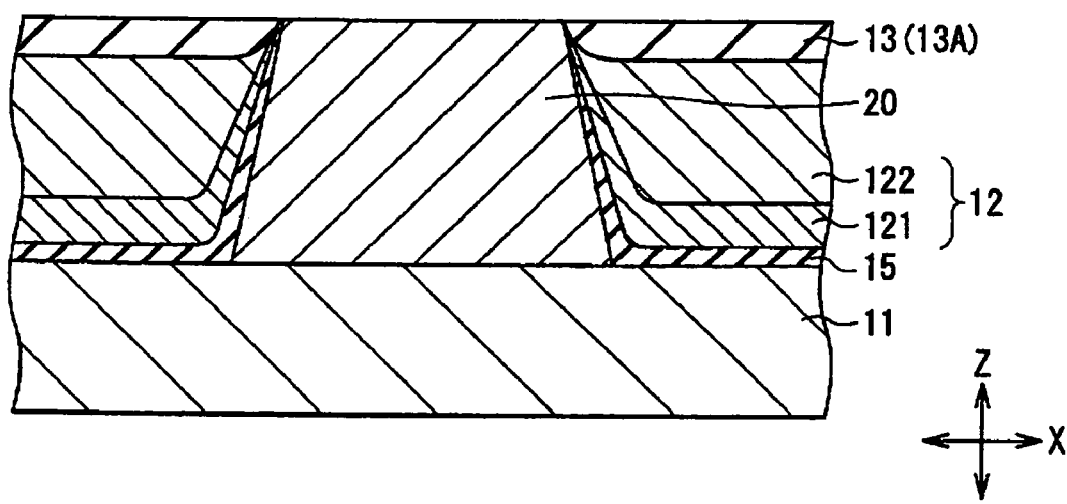
FIG. 12 is a cross section of the main part illustrating a process subsequent to FIG. 11.

After that, the multilayer film 20Z is selectively etched by using the photoresist pattern 61 as a mask by dry etching such as ion milling or RIE. In this case, dry etching is performed to reach the lower electrode 11. As a result, the MR film 20 having a width Tw is formed as shown in FIG. 11. The width Tw is an average device width of the MR film 20. After formation of the MR film 20, as shown in FIG. 12, the pair of insulating films 15 and the pair of magnetic domain control films 12 are formed on both sides while sandwiching the MR film 20 in the X-axis direction. Concretely, the insulating film 15, the base layer 121, and the magnetic domain control layer 122 are formed in order on the whole face by, for example, sputtering or the like. Further, by lifting off the photoresist pattern 61, the MR film 20, the pair of insulating film 15 opposed to each other while sandwiching the MR film 20, and the pair of magnetic domain control film 12 formed of the base layer 121 and the magnetic domain control layer 122 appear.

Figure 13:
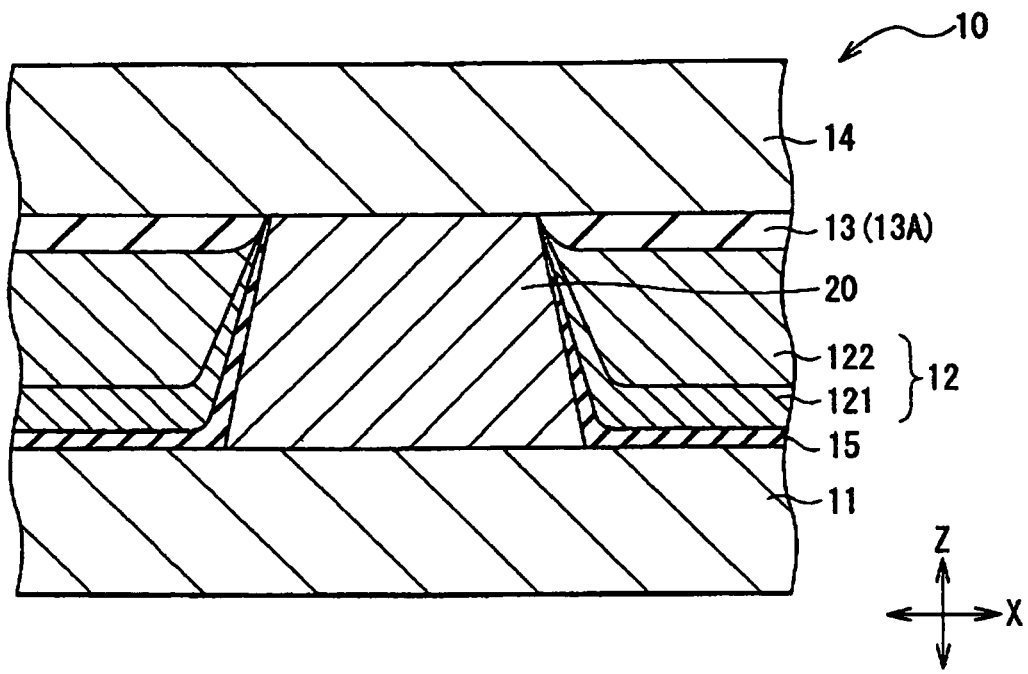
FIG. 13 is a cross section of the main part illustrating a process subsequent to FIG. 12.

After removal of the photoresist pattern 61, as shown in FIG. 13, the upper electrode 14 is formed on the whole surface, thereby completing the MR device 10. After that, as shown in FIGS. 3 and 4, the insulating layer 16 is formed on the whole surface, thereby completing the read head part 1A. Subsequently, the lower magnetic electrode 41 and the recording gap layer 42 are formed in order on the read head part 1A, and the coil 44 is selectively formed on the recording gap layer 42. After that, by etching part. of the recording gap layer 42, the opening 42A is formed. The insulating layer 45 is formed so as to cover the coil 44 and, further, the pole tip 43 and the coupling part 46 are sequentially formed. Finally, the upper magnetic pole 47 is formed so as to cover the whole, thereby completing the recording head part 1B. After that, for example, by performing predetermined processes such as a process of lapping the slider 2A to form the recording medium facing surface 9, the thin film magnetic head 1 completes.

As described above, in the MR device 10 of the embodiment, RuCu is used as the material of the nonmagnetic intermediate layer 232. Consequently, as compared with the case of making the nonmagnetic intermediate layer of ruthenium, the resistance value when current is passed in the stacking direction is increased, and the influence of spin information in the second magnetization pinned layer 233 on the magnetization free layer 25 can be reduced. As a result, decrease in the resistance change amount $A\Delta R$ of the whole caused by the second magnetization pinned layer 233 can be suppressed. As compared with the case of making the nonmagnetic intermediate layer of RuFe, the strength of exchange coupling can be increased. As a result, in the magnetic fields in a wider range, the first and second magnetization pinned layers 231 and 233 which are thicker can be antiferromagnetically coupled to each other. Consequently, the thickness of the magnetic film in the first magnetization pinned layer 231 can be increased, and both increase in the resistance change amount $A\Delta R$ of the whole and stability of the magnetic fields can be achieved. Therefore, while reducing the influence of external noise and holding stable operation, by increase in the resistance change amount $A\Delta R$ of the whole, the invention can address higher recording density.

In particular, in the case of making the first and second adjacent layers 231A and 233A of $Co_xFe_{1-x}$ ($0.7 \leq X \leq 1.0$), stable antiferromagnetic coupling is obtained in the SyAP layer 23, and the MR device 10 displaying stable resistance change rate (MR change rate) can be obtained. In the case of making the first and second adjacent layers 231A and 233A of $Co_{90}Fe_{10}$, the MR device 10 displaying more stable resistance change rate (MR change rate) can be obtained.

Second Embodiment

Figure 14:
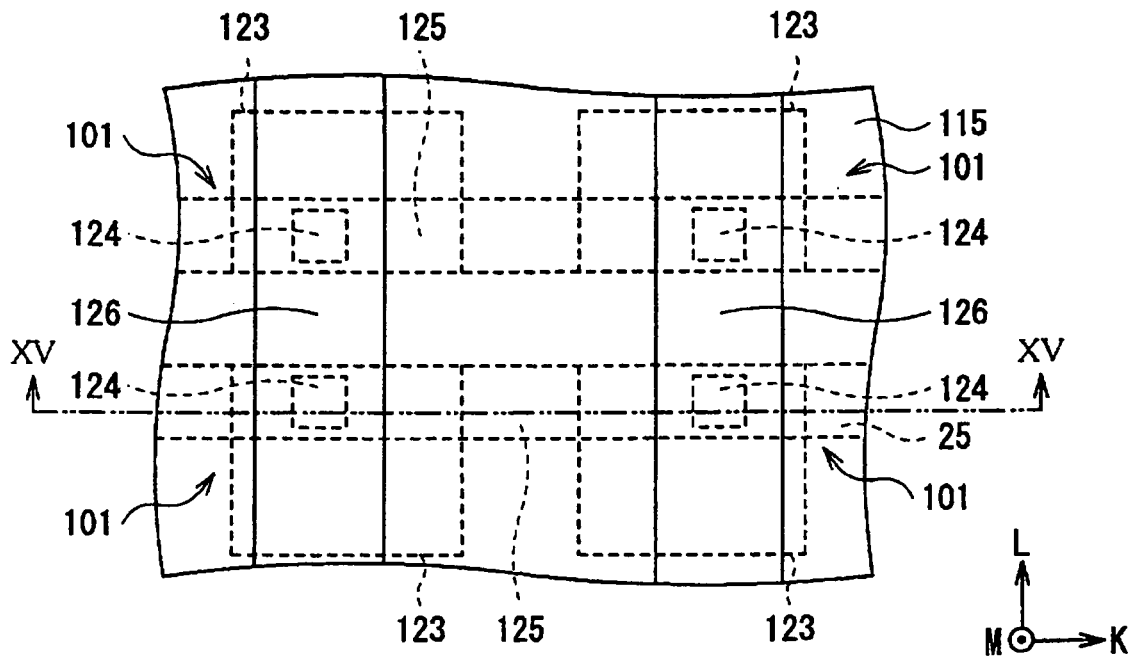
FIG. 14 is an enlarged schematic plan view of a part of an MRAM array having magnetic memory cells as a second embodiment of the invention.
Figure 15:
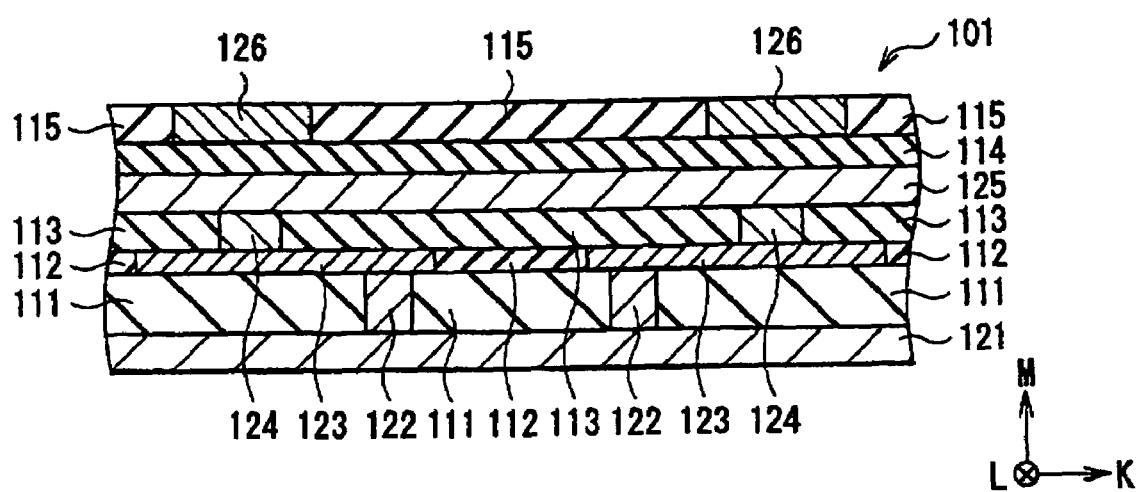
FIG. 15 is a schematic view showing a stack sectional configuration of an MRAM array illustrated in FIG. 14.
Figure 16:
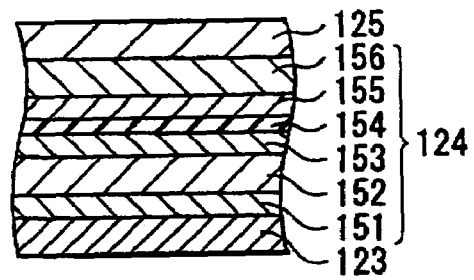
FIG. 16 is a schematic cross section showing a stack sectional configuration of an MR film included in the magnetic memory cell illustrated in FIG. 14.

By referring to FIGS. 14 to 16, a magnetic memory cell and a magnetic memory cell array having the same as a second embodiment of the present invention will be described below. FIG. 14 is an enlarged plan view of a part of a magnetic memory cell array (hereinbelow, called MRAM array) in which a plurality of magnetic memory cells 101 of the second embodiment are arranged in a matrix. FIG. 15 shows a sectional structure taken along the XV-XV cut line illustrated in FIG. 14.

As shown in FIGS. 14 and 15, the MRAM array has a plurality of word lines 126 extended in the L-axis direction and arranged in the K-axis direction so as to be parallel with each other in a first level, and a plurality of bit lines 125 extended in the K-axis direction and arranged in the L-axis direction so as to be parallel with each other in a second level different from the first level. Further, one MR film 124 and one lower electrode 123 are provided to construct one magnetic memory cell 101 at each of intersecting points of the word lines 126 and the bit lines 125.

Each magnetic memory cell 101 has a configuration in which the lower electrode 123 having a predetermined shape (for example, a rectangular shape), the MR film 124, the bit line 125 extending in the X-axis direction, and the word line 126 extending in the Y-axis direction are stacked in order on a substrate 121. In FIG. 14, four MR films 124, two bit lines 125, and two word lines 126 are shown (that is, four magnetic memory cells 101 are shown). The substrate 121 is made of a semiconductor material such as silicon and includes other devices such as a transistor and a diode. On the substrate 121, a conductive connection layer 122 to be electrically connected to the lower electrode 123 is provided so as to be surrounded by a first insulating layer 111. The lower electrode 123 provided on the connection layer 122 and a second insulating layer 112 surrounding the lower electrode 123 form a common plane.

The connection layer 122 is made of tungsten (W), aluminum (Al), copper (Cu), or the like, and the lower electrode 123 is made of tungsten (W), aluminum (Al), copper (Cu), tantalum (Ta), ruthenium (Ru), or the like. The first and second insulating layers 111 and 112 are made of a material having low dielectric constant such as silicon oxide.

The MR film 124 and a third insulting layer 113 surrounding the MR film 124 are provided as an upper layer on the lower electrode 123 and the second insulating layer 112. The third insulating layer 113 is made of a material having low dielectric constant such as silicon oxide. FIG. 16 shows an example of a detailed configuration of the MR film 124. The MR film 124 is a columnar stack made of a plurality of layers and is a so-called CPP-GMR device including a magnetic metal layer and a nonmagnetic metal layer. The MR film 124 has, for example, a configuration in which a base layer 151, an antiferromagnetic layer 152, a synthetic antiferromagnetic pinned layer (hereinbelow, called SyAP layer) 153, a nonmagnetic spacer layer 154, a magnetization free layer 155, and a protection layer 156 are stacked in order on the lower electrode 123. The base layer 151, antiferromagnetic layer 152, SyAP layer 153, nonmagnetic spacer layer 154, magnetization free layer 155, and protection layer 156 have configurations similar to those of the base layer 21, antiferromagnetic layer 22, SyAP layer 23, nonmagnetic spacer layer 24, magnetization free layer 25, and protection layer 26, respectively. To be specific, the SyAP layer 153 has a three-layer structure constructed by a nonmagnetic intermediate layer made of RuCu and first and second magnetization pinned layers made of, for example, $Co_{90}Fe_{10}$.

Each of the bit lines 125 extends so as to be in contact with a plurality of MR films 124 arranged in the K-axis direction and is made of a metal having high conductivity such as copper (Cu) or gold (Au). Between the bit lines 125, a dielectric layer (not shown) whose top face is coplanar with the bit lines 125 is formed.

The word lines 126 are disposed over the layer including the bit lines 125 via a fourth insulating layer 114, and extend parallel with each other in the L-axis direction. In the same layer as the word lines 126, a fifth insulating layer 115 is formed so as to surround the word lines 126. The word lines 126 and the fifth insulating layer 115 form a plane.

At the time of writing information to a desired magnetic memory cell 101 in the MRAM array having such a configuration, write current is passed simultaneously to a set of the bit line 125 and the word line 126 forming the intersecting point in the position corresponding to the magnetic memory cell 101. On the other hand, at the time of reading information written in the desired magnetic memory cell 101, it is sufficient to pass read current to the lower electrode 123 and the bit line 125 connected to the magnetic memory cell 101. In the embodiment, a pair of read lines is constructed by the bit line 125 and the lower electrode 123, and a pair of write lines is constructed by the bit line 125 and the word line 126 (that is, the bit line 125 serves as one of the read lines and one of the write lines). It is also possible to newly provide another write line which crosses the word line 126 and use the bit line 125 as a dedicated read line.

As described above, in the magnetic memory cell 101 of the embodiment, a ruthenium copper alloy (RuCu) is used as the material of the nonmagnetic intermediate layer in the SyAP layer 153, so that the resistance change amount AΔR of the MR film 124 as a whole increases, and the resistance change rate improves. Thus, higher packing density and higher integration can be achieved.

Third Embodiment

By referring to FIGS. 17A to 17C and FIG. 18, a current sensor as a third embodiment of the present invention will now be described.

Figure 17A:
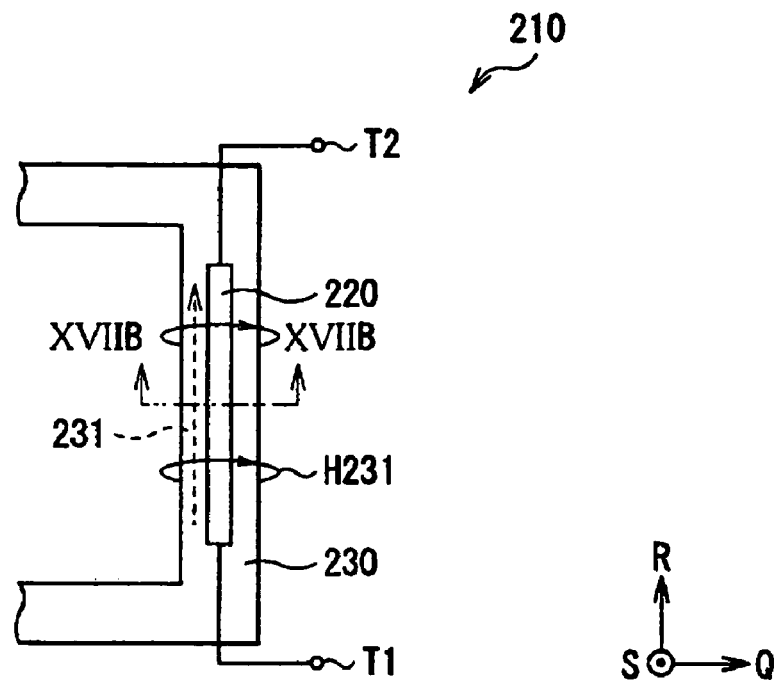
FIGS. 17A to 17C are schematic views showing a configuration of a current sensor as a third embodiment of the invention.
Figure 17B:
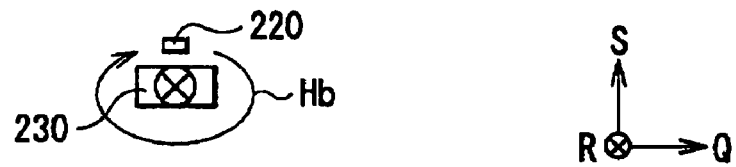
Figure 17C:
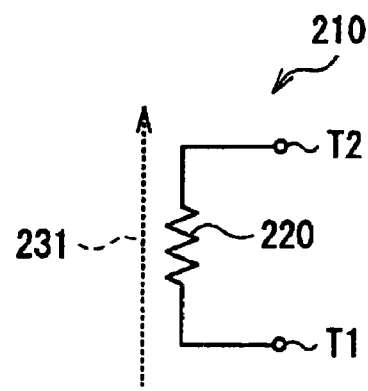

FIGS. 17A to 17C show a schematic configuration of a current sensor 210 of the third embodiment. FIG. 17A shows a plane configuration of the current sensor 210. FIG. 17B shows a sectional configuration of the current sensor 210 taken along line XVII-XVII of FIG. 17A. FIG. 17C shows an equivalent circuit corresponding to FIG. 17A. The current sensor 210 functions to detect the intensity of a current magnetic field generated by current flowing near the current sensor 210, thereby measuring the magnitude of the current.

As shown in FIG. 17A, the current sensor 210 has a configuration in which an MR film 220 and a current line 230 which is provided adjacent to the MR film 220 and through which current to be detected flows are formed over a not-shown substrate. The MR film 220 has a pinned layer whose magnetization direction is pinned in a predetermined direction (+R direction in FIGS. 17A and 17B) as will be described in detail later. The current line 230 is disposed so as to extend in the magnetization direction of a magnetization pinned film 223 (which will be described later) near the MR film 220. A current 231 to be detected flows in the current line 230. The current 231 to be detected can be passed in the direction of the arrow (the +R direction near the MR film 220) and can be also passed in the opposite direction (the –R direction near the MR film 220) as shown in FIGS. 17A and 17B. A conductor is connected aside from the current line 230 to the MR film 220 and read current can be passed between terminals T1 and T2. In the configuration, the MR film 220 can be regarded as a resistor, so that the current sensor 210 is an equivalent circuit as shown in FIG. 17C.

Figure 18:
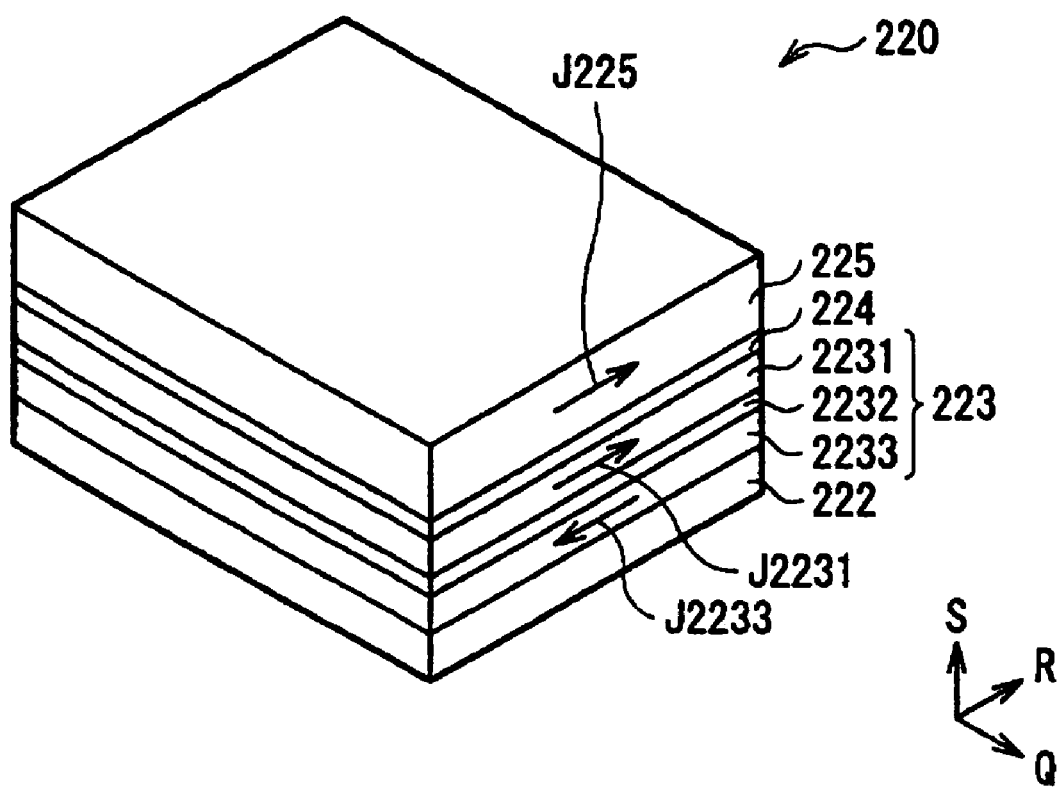
FIG. 18 is a perspective view showing a configuration of a stacked body included in the current sensor illustrated in FIG. 17.

The MR film 220 is constructed by stacking a plurality of function films including a magnetic layer and is obtained by stacking an antiferromagnetic layer 222, a synthetic antiferromagnetic pinned layer (hereinbelow, SyAP layer) 223, a nonmagnetic spacer layer 224, and a magnetization free layer 225 as shown in FIG. 18. The antiferromagnetic layer 222, SyAP layer 223, nonmagnetic spacer layer 224, and magnetization free layer 225 have configurations similar to those of the base layer 21, antiferromagnetic layer 22, SyAP layer 23, nonmagnetic spacer layer 24, and magnetization free layer 25, respectively.

Concretely, the SyAP layer 223 includes a first magnetization pinned layer 2231 having a magnetization direction J2231 pinned along a predetermined direction (for example, +R direction), a second magnetization pinned layer 2233 having a magnetization direction J2233 pinned (in the –R direction) so as to be antiparallel with the predetermined direction, and a nonmagnetic intermediate layer 2232 sandwiched by the first and second magnetization pinned layers 2231 and 2233. The magnetization free layer 225 is constructed to have a magnetization direction J225 which changes according to the magnitude and direction of a current magnetic field H231 generated by the current 231 to be detected and, when the current magnetic field H231 is zero (H231=0), becomes parallel to the magnetization direction J2231 of the first magnetization pinned layer 2231. Further, the axis of easy magnetization of the magnetization free layer 225 is set to be parallel to the magnetization direction J2231.

The current line 230 is made of a metal material having high conductivity such as copper (Cu) or gold (Au).

In the case of performing sensing by using the current sensor 210 of the embodiment, as shown in FIG. 17, read current is passed in advance between the terminals T1 and T2 and, in the state, the current 231 to be detected is passed to the current line 230. When the current 231 to be detected is passed in the +R direction, the current magnetic field H231 in the +Q direction is generated and applied to the MR film 220. By preliminarily grasping the relation between the current magnetic field H231 and the resistance change amount, a change in the current magnetic field H231 can be detected. By applying the bias magnetic field in the same direction as that of the current magnetic field H231, higher-precision detection can be performed.

In the current sensor 210 of the embodiment, in particular, the RuCu alloy is used as the material of the nonmagnetic intermediate layer 2232 in the SyAP layer 223. Consequently, the resistance change amount of the MR film 220 as a whole increases, and the resistance change rate improves. Thus, without increasing the dimensions, sensitivity can be improved and a smaller current to be detected can be measured.

EXAMPLES

Concrete examples of the invention will now be described.

In the following first and second examples (Examples 1 and 2) of the invention, samples of the MR device 10 having the sectional structure shown in FIG. 5 were formed on the basis of the manufacturing method described in the first embodiment, and characteristics of the samples were examined. The details will be described by referring to Tables 1 to 3 and FIGS. 19 and 20.

Example 1

The sample of Example 1 has the configuration shown in the following table 1.

TABLE 1

| Configuration of MR film 20 | | Materials | Thickness [nm] | Magnetic thickness $M_S \cdot T$ [kA] |
|---|---|---|---|---|
| Protection layer 26 | | Ru | 10.0 | — |
| | | Cu | 5.0 | |
| Magnetization free layer 25 | | $Co_{70}Fe_{30}$ | 1.0 | — |
| | | $Ni_{82}Fe_{18}$ | 2.0 | |
| | | $Co_{70}Fe_{30}$ | 0.5 | |
| | | Cu | 0.2 | |
| | | $Co_{70}Fe_{30}$ | 0.5 | |
| | | $Ni_{82}Fe_{18}$ | 2.0 | |
| | | $Co_{70}Fe_{30}$ | 1.0 | |
| Nonmagnetic spacer layer 24 | | Cu | 3.0 | — |
| Magnetization pinned layer 23 | First magnetization pinned layer 231 | $Co_{50}Fe_{50}$ | 1.3 | 826.13 |
| | | Cu | 0.2 | |
| | | $Co_{50}Fe_{50}$ | 1.3 | |
| | | Cu | 0.2 | |
| | | $Co_{50}Fe_{50}$ | 1.3 | |
| | | Cu | 0.2 | |
| | (First adjacent layer) | $Co_{90}Fe_{10}$ | 1.0 | |
| | Nonmagnetic intermediate layer 232 | RuCu | T | — |
| | (Second adjacent layer) | $Co_{90}Fe_{10}$ | 3.9 | 689.35 |
| | Second magnetization pinned layer 233 | $Co_{30}Fe_{70}$ | 0.5 | |
| | | $Co_{90}Fe_{10}$ | 0.5 | |
| Antiferromagnetic layer 22 | | IrMn | 7.0 | — |
| Base layer 21 | | NiFeCr | 5.0 | — |
| | | Ta | 1.0 | |

Figure 19:
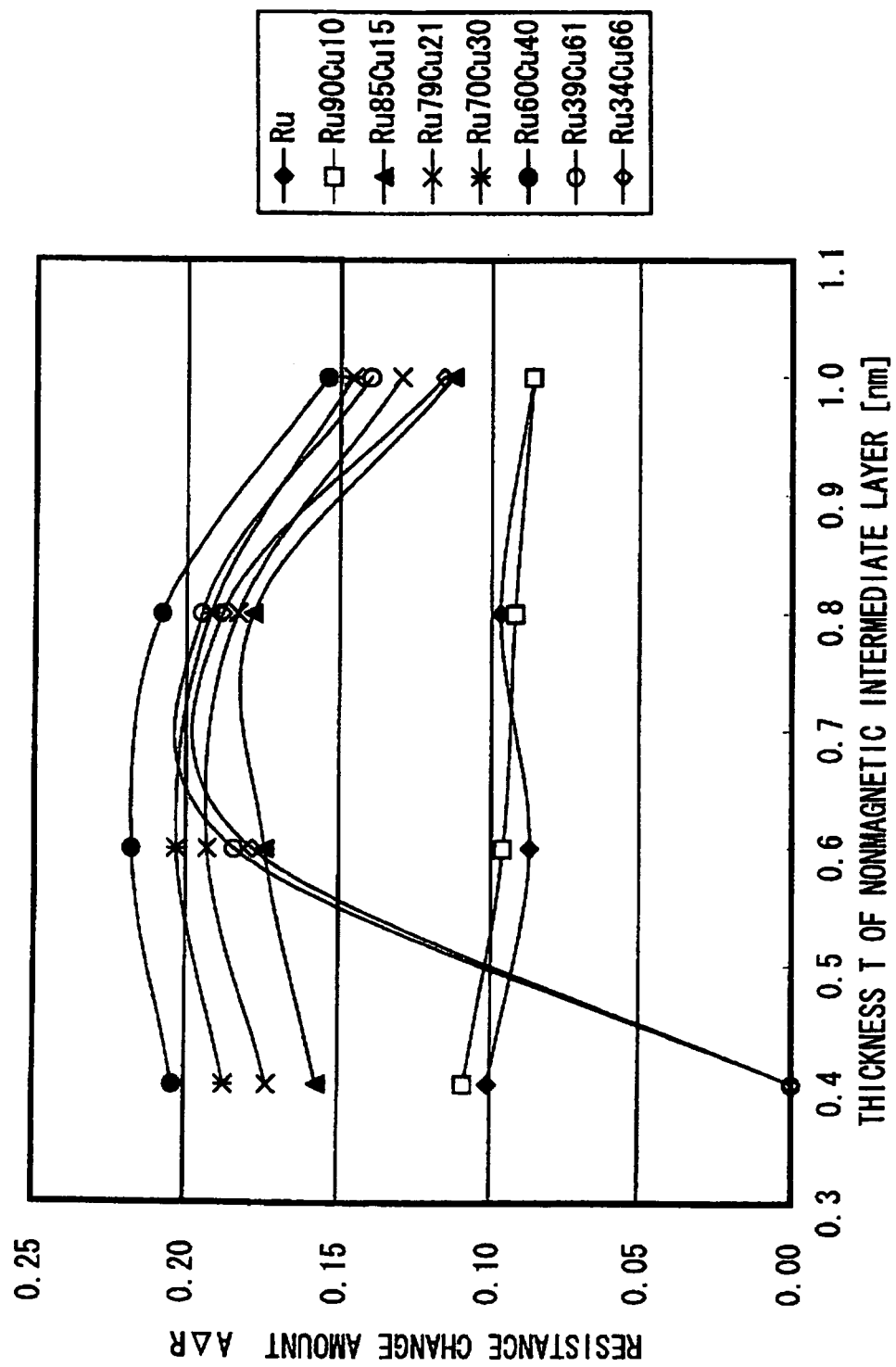
FIG. 19 is a characteristic diagram showing the relation between the thickness of a nonmagnetic intermediate layer and a resistance change amount in the thin film magnetic head as a first example.
Figure 20A:
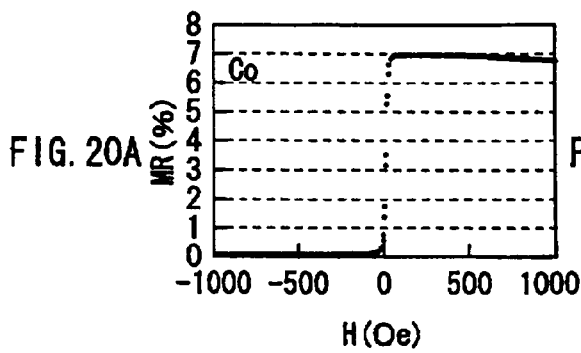
FIGS. 20A to 20E are characteristic diagrams showing the relation between compositions of first and second adjacent layers in a thin film magnetic head as a second example and a resistance change rate of an MR device.
Figure 20B:
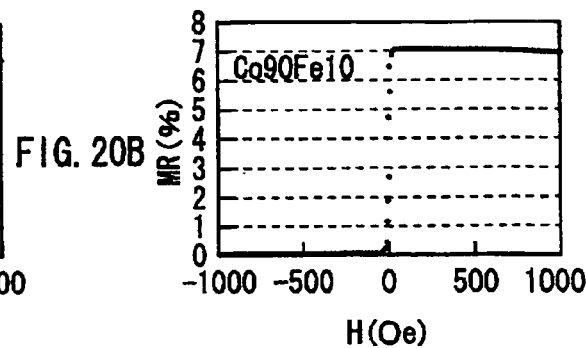
Figure 20C:
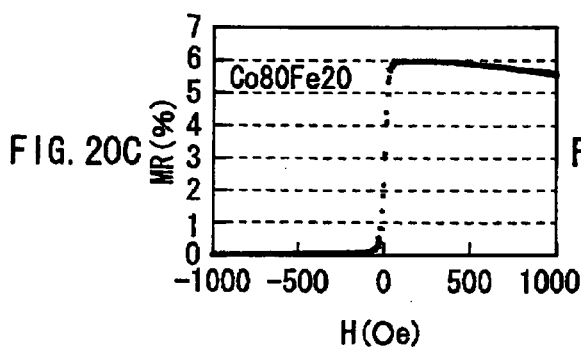
Figure 20D:
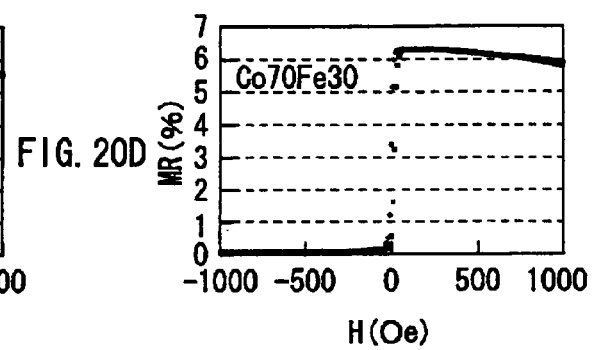
Figure 20E:
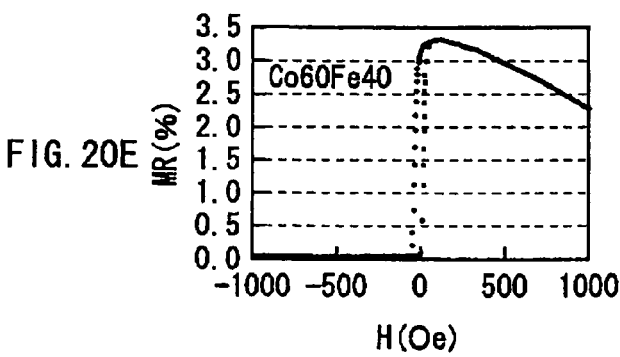

In Example 1, the relation between the thickness T of the nonmagnetic intermediate layer 232 and the resistance change amount $A\Delta R$ (A denotes the horizontal sectional area of the MR device 10) was examined. The result is shown in Table 2 and FIG. 19. While changing the content of ruthenium (Ru), a plurality of samples made of RuCu of different compositions were manufactured, and their resistance change amounts $A\Delta R$ were measured. As comparison data, the resistance change amount $A\Delta R$ of the nonmagnetic intermediate layer 232 made of ruthenium was measured and is shown in Table 2 and FIG. 19. In FIG. 19, the horizontal axis indicates thickness T of the nonmagnetic intermediate layer and the vertical axis indicates the resistance change amount $A\Delta R$.

TABLE 2

| Resistance change amount $A\Delta R$ | | Thickness [nm] | | | |
|---|---|---|---|---|---|
| | | 0.4 | 0.6 | 0.8 | 1.0 |
| Composition | Ru | 0.101 | 0.087 | 0.097 | 0.086 |
| | $Ru_{90}Cu_{10}$ | 0.109 | 0.096 | 0.092 | 0.086 |
| | $Ru_{85}Cu_{15}$ | 0.157 | 0.174 | 0.178 | 0.113 |
| | $Ru_{79}Cu_{21}$ | 0.173 | 0.193 | 0.183 | 0.130 |
| | $Ru_{70}Cu_{30}$ | 0.187 | 0.203 | 0.192 | 0.146 |
| | $Ru_{60}Cu_{40}$ | 0.204 | 0.218 | 0.208 | 0.154 |
| | $Ru_{39}Cu_{61}$ | 0.000 | 0.184 | 0.195 | 0.140 |
| | $Ru_{34}Cu_{66}$ | 0.000 | 0.178 | 0.188 | 0.116 |

As obvious from Table 2 and FIG. 19, in the case of using RuCu whose ruthenium content is in the range from 60 at % to 85 at %, the resistance change amount $A\Delta R$ which is sufficiently larger than that in the case of constructing the nonmagnetic intermediate layer 232 of ruthenium can be obtained. By limiting the nonmagnetic intermediate layer 232 to have the thickness in the range from 0.4 nm to 0.8 nm, a larger resistance change amount $A\Delta R$ can be obtained. On the other hand, in the case of $Ru_{39}Cu_{61}$ and $Ru_{34}Cu_{66}$, when the thickness is 0.4 nm, the nonmagnetic intermediate layer 232 does not function as the nonmagnetic intermediate layer, and the first and second magnetization pinned layers 231 and 233 are not antiferromagnetically coupled to each other, so that the thickness of 0.6 nm or larger is required. The thin film having a thickness less than 0.4 nm is difficult to be manufactured irrespective of the composition.

In FIG. 19, the resistance change amount $A\Delta R$ largely changes between $Ru_{90}Cu_{10}$ and $Ru_{85}Cu_{16}$. However, in the graph of ruthenium content dependency of the resistivity $\rho$ shown in FIG. 8, such a large change is not seen. Therefore, it is considered that the spin scattering length Ls expressed by the equation (4) is shortened by a factor other than the mean free path. Since the Fermi velocity $V_F$ is almost constant when the materials of the alloy are the same, it is estimated that the spin relaxation time $\tau_{SF}$ is shortened between $Ru_{90}Cu_{10}$ and $Ru_{85}Cu_{16}$.

Example 2

The sample of Example 2 has the configuration shown in the following table 3.

TABLE 3

| Configuration of MR film 20 | Materials | Thickness [nm] | Magnetic thickness $M_S \cdot T$ [kA] |
|---|---|---|---|
| Protection layer 26 | Ru | 10.0 | — |
| | Cu | 5.0 | |

TABLE 3-continued

| Configuration of MR film 20 | | Materials | Thickness [nm] | Magnetic thickness $M_S \cdot T$ [kA] |
|---|---|---|---|---|
| Magnetization free layer 25 | | $Co_{70}Fe_{30}$ | 1.0 | — |
| | | $Ni_{82}Fe_{18}$ | 2.0 | |
| | | $Co_{70}Fe_{30}$ | 0.5 | |
| | | Cu | 0.2 | |
| | | $Co_{70}Fe_{30}$ | 0.5 | |
| | | $Ni_{82}Fe_{18}$ | 2.0 | |
| | | $Co_{70}Fe_{30}$ | 1.0 | |
| Nonmagnetic spacer layer 24 | | Cu | 3.0 | — |
| Magnetization pinned layer 23 | First magnetization pinned layer 231 | $Co_{50}Fe_{50}$ | 1.3 | 826.13 |
| | | Cu | 0.2 | |
| | | $Co_{50}Fe_{50}$ | 1.3 | |
| | | Cu | 0.2 | |
| | | $C_{50}Fe_{50}$ | 1.3 | |
| | | Cu | 0.2 | |
| | (First adjacent layer) | CoFe | 1.0 | |
| | Nonmagnetic intermediate layer 232 | $Ru_{85}Cu_{15}$ | 0.4 | — |
| | (Second adjacent layer) | CoFe | 3.9 | 689.35 |
| | Second magnetization pinned layer 233 | $Co_{30}Fe_{70}$ | 0.5 | |
| | | $Co_{90}Fe_{10}$ | 0.5 | |
| Antiferromagnetic layer 22 | | IrMn | 7.0 | — |
| Base layer 21 | | NiFeCr | 5.0 | — |
| | | Ta | 1.0 | |

In Example 2, the relation between the compositions of the first and second adjacent layers 231A and 233A made of CoFe or cobalt (Co) adjacent to the nonmagnetic intermediate layer 232 and the resistance change rate (MR ratio) of the MR device 10 was examined. The result is shown in FIGS. 20A to 20E. While changing the content of cobalt in CoFe of the first and second adjacent layers 231A and 233A, a plurality of samples of different compositions were manufactured, and their resistance change rates ΔR/R were measured. Concretely, the cobalt content was set as 100 at %, 90 at %, 80 at %, 70 at %, and 60 at % in FIGS. 20A, 20B, 20C, 20D, and 20E, respectively. Different from Example 1, the nonmagnetic intermediate layer 232 was made of $Ru_{85}Cu_{15}$ and formed to a thickness of 0.4 nm. In FIGS. 20A to 20E, the horizontal axis indicates applied magnetic field H(×10³/(4π) A/m) and the vertical axis indicates the resistance change rate ΔR/R (%).

As obvious from FIGS. 20A to 20E, the behavior of the resistance change rate ΔR/R largely varies depending on the composition ratio of CoFe in the region of the positive magnetic field. It shows that the quality of the antiferromagnetic coupling, that is, the magnetic field range in which the relative angle between the magnetization pinned layer 25 and the first magnetization pinned layer 231 maintains 180 degrees changes according to the cobalt content. As the cobalt content decreases (as compared with a low magnetic field), decrease in the resistance change rate ΔR/R in a high magnetic field is seen conspicuously. At the cobalt content of 60%, the absolute value of the resistance change rate ΔR/R itself deteriorates conspicuously. To assure stable operation of the magnetoresistive device, preferably, the resistance change rate ΔR/R is stable without depending on the magnitude of the applied magnetic field H. From such a viewpoint, it is preferable to use $Co_xFe_{100-x}$ (70≦X≦100) for the first and second adjacent layers sandwiching the nonmagnetic intermediate layer 232. Further, it was confirmed that when the first and second magnetization pinned layers 231 and 233 are formed so as to include the first and second adjacent layers having such a composition, excellent antiferromagnetic coupling is obtained without depending on the configurations of the other films included in the first and second magnetization pinned layers 231 and 233. The tendency of stability of the resistance change rate ΔR/R with respect to the applied magnetic field H does not depend on the composition of RuCu of the nonmagnetic intermediate layer 232.

Example 3

Further, from the viewpoint of the exchange coupling constant J, preferable composition ratio and thickness of the nonmagnetic intermediate layer was examined. A sample of a stack having the configuration shown in Table 4 was formed, the magnetization of the sample was measured and, on the basis of the result, the exchange coupling constant J was obtained. A plurality of samples of stacks having different compositions of RuCu each constructing the nonmagnetic intermediate layer were manufactured.

TABLE 4

| Example 3 | | Material | Thickness [nm] |
|---|---|---|---|
| | Protection layer | Ru | 10.0 |
| | | Cu | 5.0 |
| Magnetization pinned layer | First magnetization pinned layer | $Co_{50}Fe_{50}$ | 1.3 |
| | Nonmagnetic intermediate layer | Ru, RuCu | T |
| | Second magnetization pinned layer | $Co_{90}Fe_{10}$ | 4.0 |
| | | $Co_{30}Fe_{70}$ | 0.5 |
| | | $Co_{90}Fe_{10}$ | 0.5 |
| | Base layer | NiFeCr | 5.0 |
| | | Ta | 1.0 |

Figure 21:
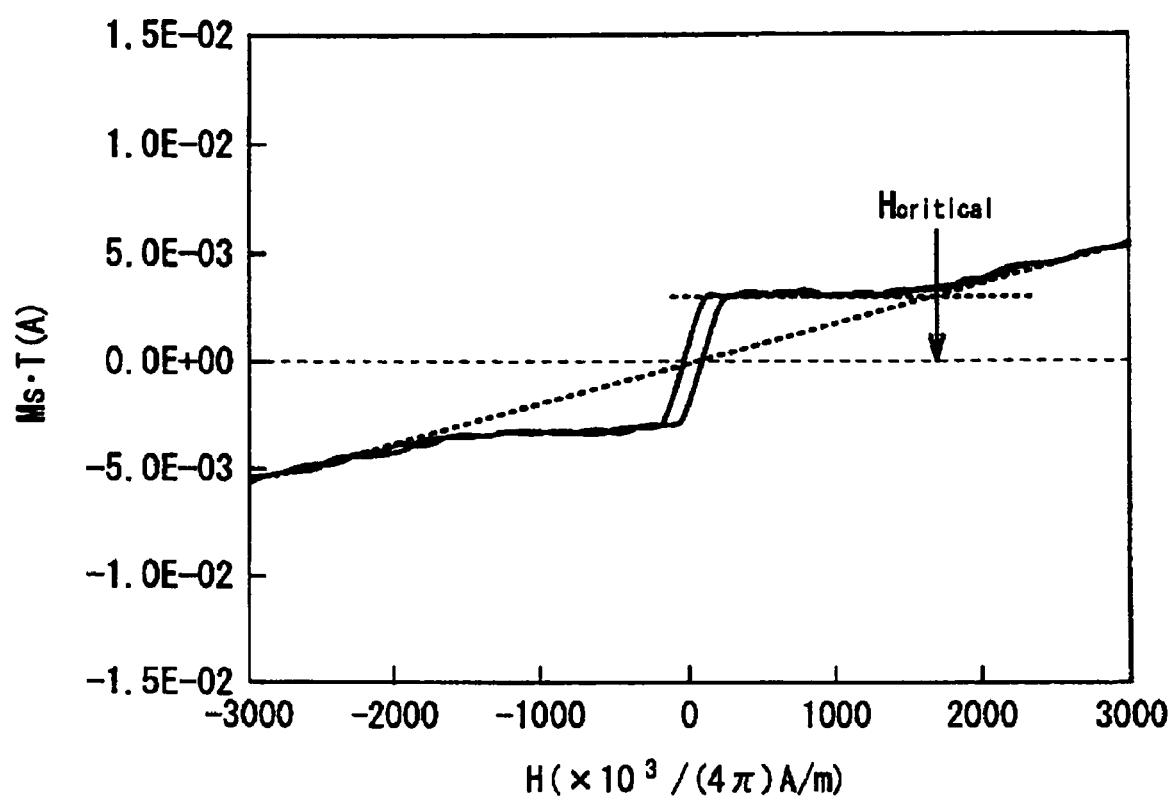
FIG. 21 shows a magnetization curve indicative of the result of magnetization measurement in a third example.

Magnetization measurement was performed using vibrating sample magnetometers (VSM) to obtain magnetization curves as shown in FIG. 21. In FIG. 21, the horizontal axis indicates the applied magnetic field H(×10³/(4π) A/m) and the vertical axis indicates the magnetic thickness Ms·T(A) as the product of magnetization and the thickness of the magnetization pinned film. From the magnetization curve, critical magnetic field $H_{critical}$ of antiferromagnetic coupling between the first and second magnetization pinned layers or saturation magnetic field $H_{saturation}$ of the antiferromagnetic coupling was determined (refer to FIG. 21), and the exchange coupling constant J(A) was derived from the equation (6) or (7). In the equations (6) and (7), M1 denotes magnetization of the first magnetization pinned layer, M2 denotes magnetization of the second magnetization pinned layer, T1 denotes thickness of the first magnetization pinned layer, and T2 indicates thickness of the second magnetization pinned layer.

$$J = \frac{M_1 t_1 \cdot M_2 t_2}{|M_1 t_1 - M_2 t_2|} H_{critical} \quad (6)$$

$$J = \frac{M_1 t_1 \cdot M_2 t_2}{M_1 t_1 + M_2 t_2} H_{saturation} \quad (7)$$

A preferable numerical value range of the exchange coupling constant J calculated in such a manner is determined as follows. First, the lower limit of the exchange coupling constant J is set as strength to the extent the direction of magnetization of the magnetization pinned film is not rotated by an external magnetic field to be detected (for example, a signal magnetic field from the magnetic recording medium). That is, to display excellent performance of the MR device, the direction of magnetization has to be sufficiently stably held even when the signal magnetic field is applied. Since the signal magnetic field (absolute value) is generally 500 Oe ($=125\times 10^3/\pi$ A/m) or less, the exchange coupling constant J which is high enough not to be influenced by the signal magnetic field is required.

Figure 22:
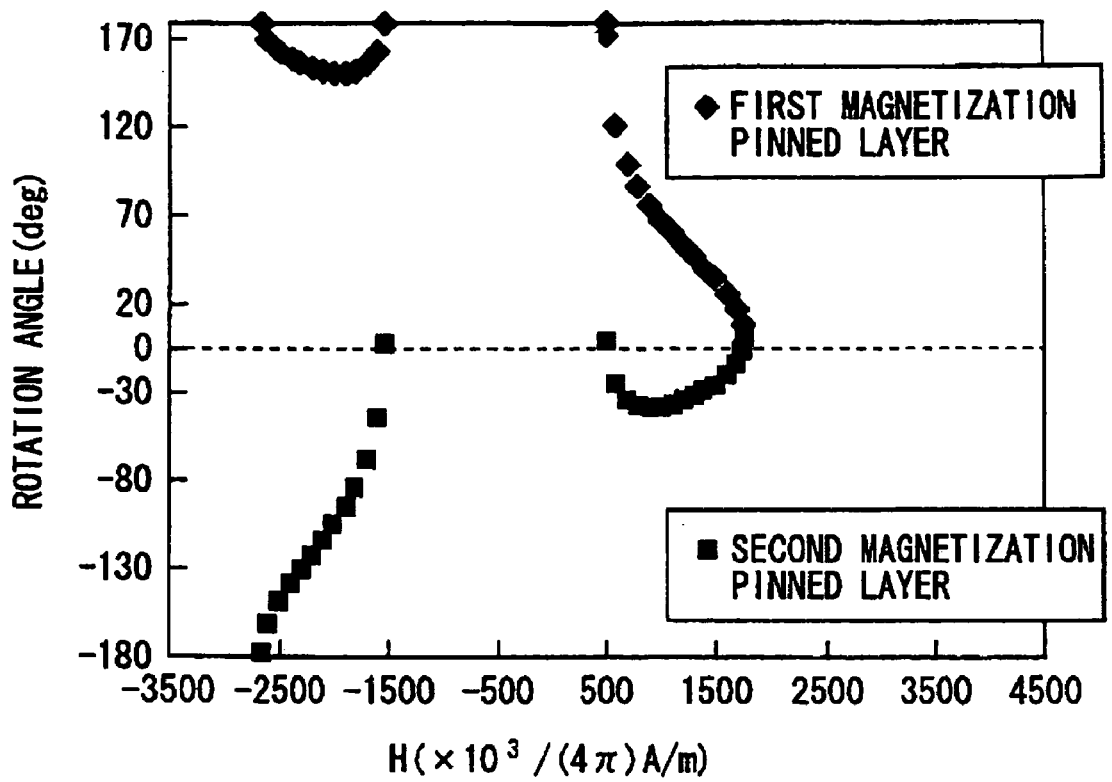
FIG. 22 is a characteristic diagram showing the relation between a rotation angle of the direction of magnetization and applied magnetic field in first and second magnetization pinned layers in the third example.

FIG. 22 shows the relation between rotation angle of the direction of magnetization of each of the first and second magnetization pinned layers calculated from the magnetic moments of the first and second magnetization pinned layers and the applied magnetic field in the case where the exchange coupling constant J is set as $0.8\times10^{-3}$ J/m$^2$ ($=0.8$ erg/cm$^2$). In FIG. 22, the horizontal axis indicates the applied magnetic field ($\times10^3/(4\pi)$ A/m) and the vertical axis indicates rotation angle (degrees) of the direction of magnetization. The rotation angle of 0° shows a state where the direction of magnetization is parallel with the applied magnetic field, and the rotation angle of 180° indicates a state where the direction of magnetization is antiparallel with the applied magnetic field. In FIG. 22, the rotation angle in the first magnetization pinned layer is shown in the upper half, and the rotation angle in the second magnetization pinned layer is shown in the lower half. As obvious from FIG. 22, the directions of magnetization in the first and second magnetization pinned layers do not rotate at 500 Oe ($=125\times10^3/\pi$ A/m) or less and start rotating over 500 Oe ($=125\times10^3/\pi$ A/m).

Figure 23:
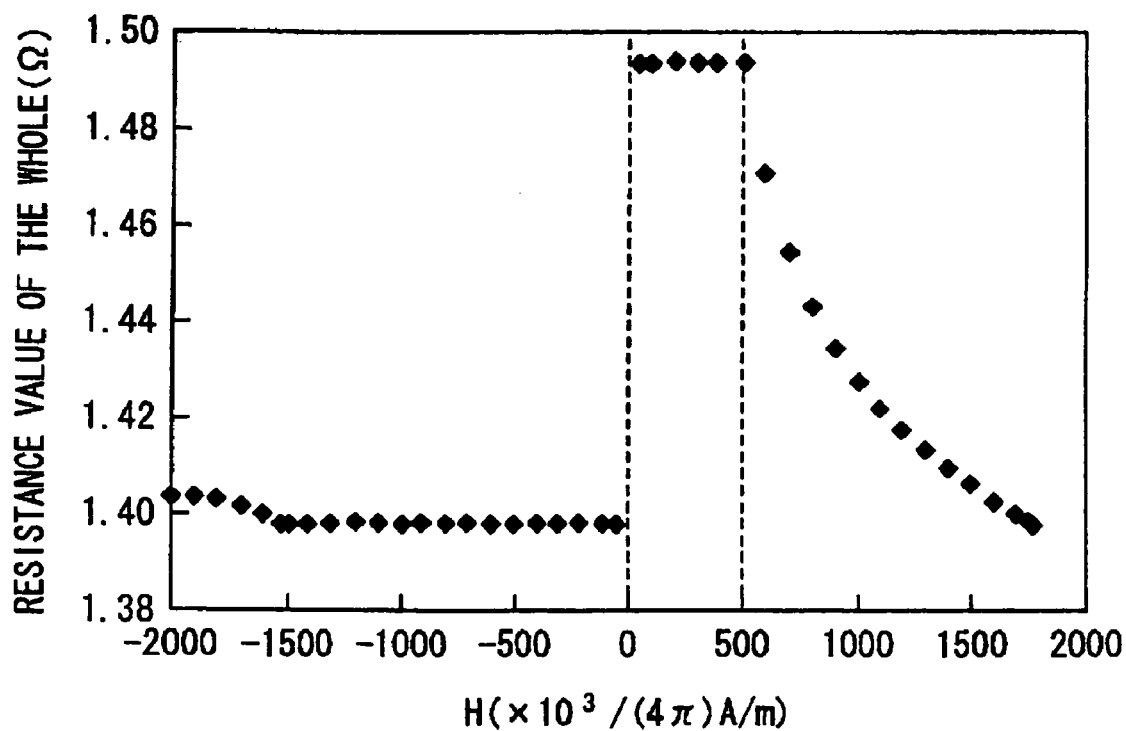
FIG. 23 is a characteristic diagram showing the relation between a total resistance value of the MR device calculated on the basis of the result of FIG. 22 and applied magnetic field.

FIG. 23 shows magnetic field dependency of the resistance value of the whole calculated on the basis of FIG. 22. FIG. 23 shows that the magnetoresistive effect gradually decreases over 500 Oe ($=125\times10^3/\pi$ A/m). From the results, it was confirmed that the desirable lower limit of the exchange coupling constant J is $0.8\times10^{-3}$ J/m$^2$.

The upper limit is set according to anneal magnetic field intensity at the time of performing annealing process (process of setting the direction of magnetization in the magnetization pinned film) in a manufacturing process. Generally, the anneal magnetic field intensity is 8 kOe ($=2\times10^6/\pi$ A/m) at the maximum. The exchange coupling constant J corresponding to the anneal magnetic field intensity is $2.99\times10^{-3}$ J/m$^2$ ($=2.99$ erg/cm$^2$).

Figure 24:
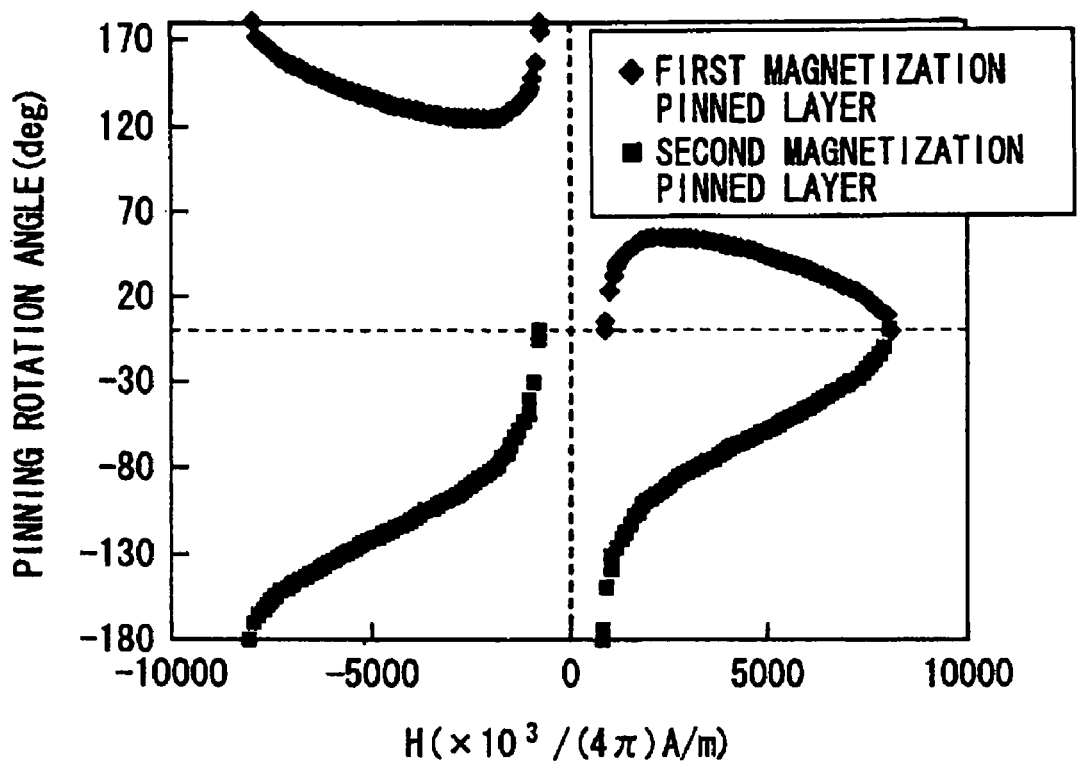
FIG. 24 is another characteristic diagram showing the relation between the rotation angle of the direction of magnetization and applied magnetic field in first and second magnetization pinned layers in the third example.
Figure 25:
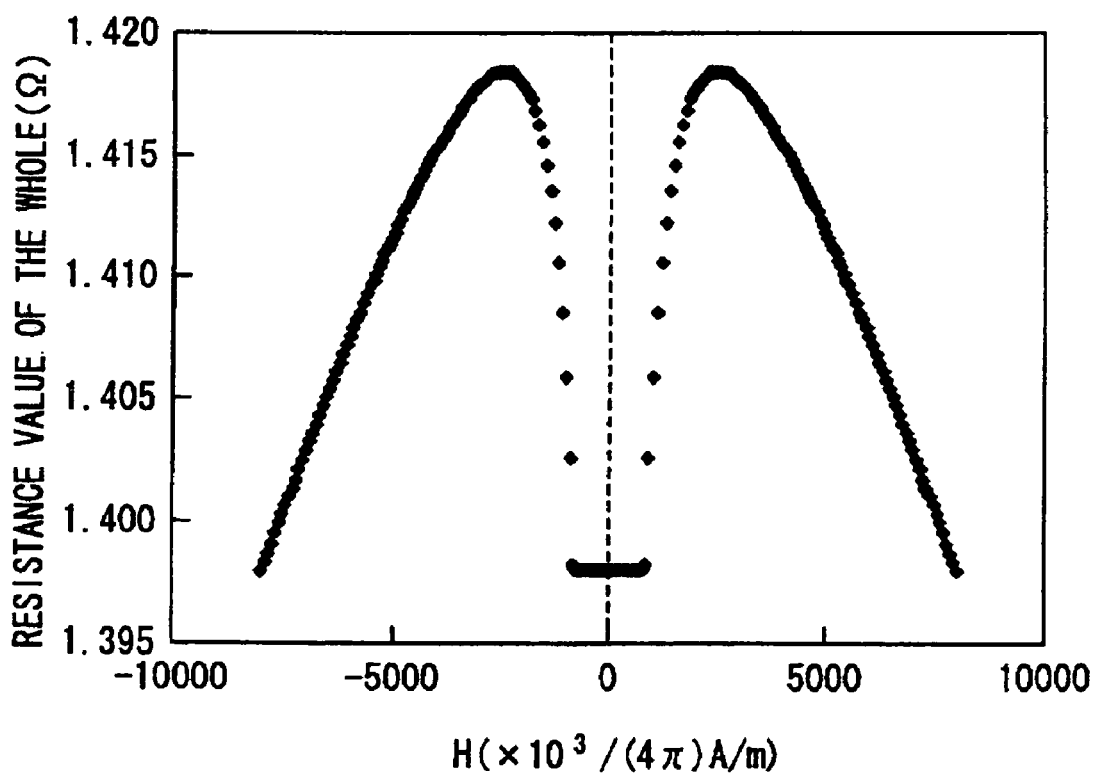
FIG. 25 is a characteristic diagram showing the relation between the total resistance value of the MR device calculated on the basis of the result of FIG. 24 and the applied magnetic field.

FIG. 24 shows the relation between rotation angle of the direction of magnetization of each of the first and second magnetization pinned layers calculated from the magnetic moments of the first and second magnetization pinned layers and the applied magnetic field in the case where the exchange coupling constant J is set as $2.99\times10^{-3}$ J/m$^2$. FIG. 25 shows magnetic field dependency of the resistance value of the whole calculated on the basis of FIG. 24. From the results of FIGS. 24 and 25, it was understood that when the applied magnetic field becomes 8 kOe ($=2\times10^6/\pi$ A/m), the direction of magnetization of each of the first and second magnetization pinned layers becomes parallel with the direction of the applied magnetic field (the rotation angle is 0°) and is saturated. It could be therefore confirmed that the desirable upper limit of the exchange coupling constant J is $2.99\times10^{-3}$ J/m$^2$.

Figure 26:
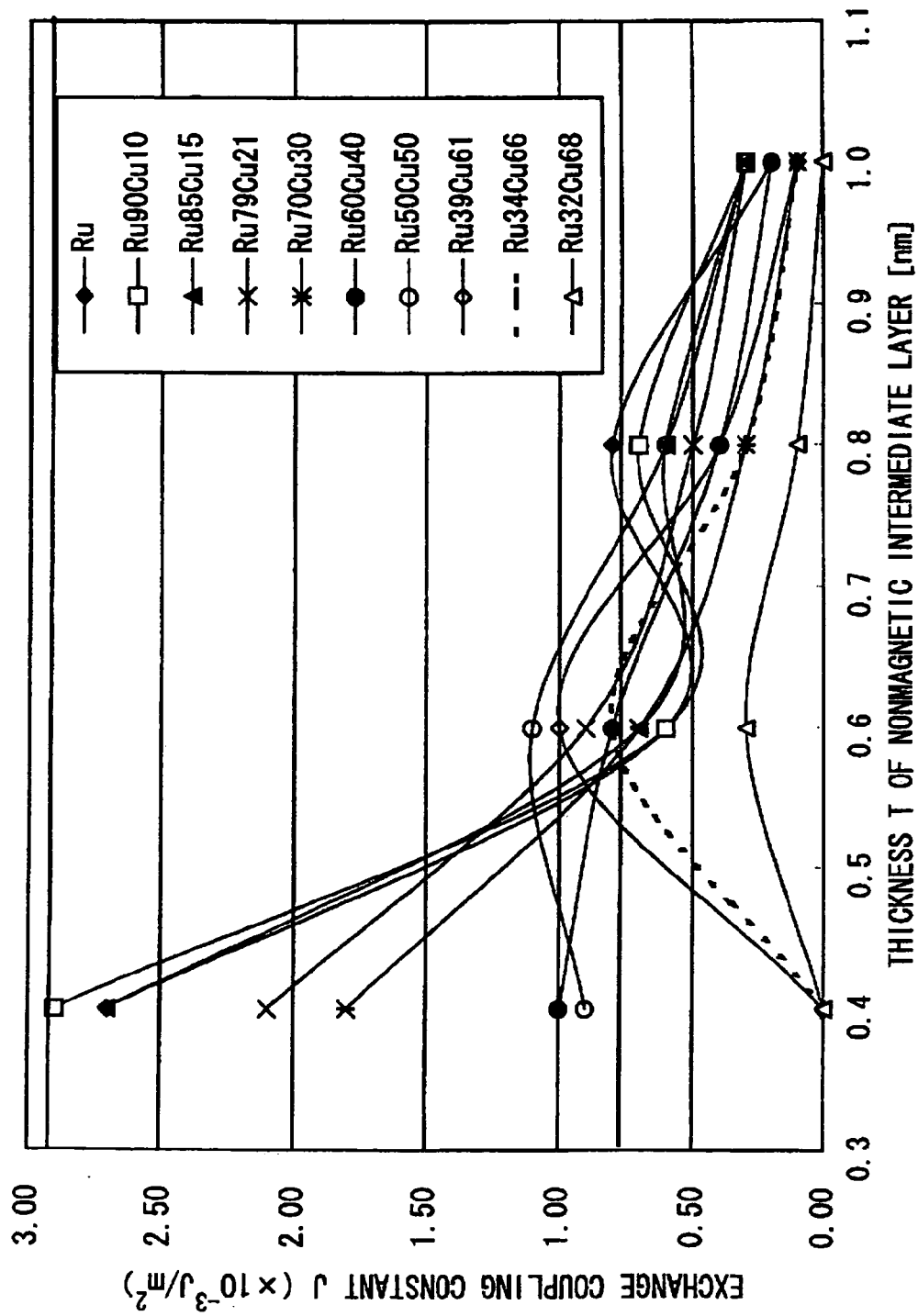
FIG. 26 is a characteristic diagram showing the relation between an exchange coupling constant of a nonmagnetic intermediate layer and thickness in the third example.

The result of examination on the relation between the exchange coupling constant J and the thickness T of the nonmagnetic intermediate layer is shown in FIG. 26. A plurality of samples having nonmagnetic intermediate layers of different compositions were manufactured by varying the ruthenium content in RuCu in the range from 32 at % to 90 at %, and the exchange coupling constant J of each of the samples was obtained. As comparison data, the exchange coupling constant J of a sample in which the nonmagnetic intermediate layer is made of ruthenium was also obtained and shown in Table 5 and FIG. 26. In FIG. 26, the horizontal axis indicates the thickness T of the nonmagnetic intermediate layer, and the vertical axis indicates the exchange coupling constant J.

TABLE 5

| Exchange coupling constant J | | Thickness [nm] | | | |
|---|---|---|---|---|---|
| | | 0.4 | 0.6 | 0.8 | 1.0 |
| Composition | Ru | 2.7 | 0.6 | 0.8 | 0.2 |
| | $Ru_{90}Cu_{10}$ | 2.9 | 0.6 | 0.7 | 0.3 |
| | $Ru_{85}Cu_{15}$ | 2.7 | 0.7 | 0.6 | 0.3 |
| | $Ru_{79}Cu_{21}$ | 2.1 | 0.9 | 0.5 | 0.3 |
| | $Ru_{70}Cu_{30}$ | 1.8 | 0.7 | 0.3 | 0.1 |
| | $Ru_{60}Cu_{40}$ | 1.0 | 0.8 | 0.4 | 0.2 |
| | $Ru_{50}Cu_{50}$ | 0.9 | 1.1 | 0.6 | 0.3 |
| | $Ru_{39}Cu_{61}$ | 0.0 | 1.0 | 0.4 | 0.1 |
| | $Ru_{34}Cu_{66}$ | 0.0 | 0.8 | 0.3 | 0.1 |
| | $Ru_{32}Cu_{68}$ | 0.0 | 0.3 | 0.1 | 0.0 |

As shown in Table 5 and FIG. 26, in the case where the nonmagnetic intermediate layer has a thickness of, for example, 0.4 nm and is made of RuCu whose ruthenium content is 70 at % to 90 at % or ruthenium only, or in the case where the nonmagnetic intermediate layer has a thickness of 0.6 nm and is made of RuCu whose ruthenium content is 34 at % to 60 at %, the exchange coupling constant J is in a particularly preferable range (from $0.8\times10^{-3}$ J/m$^2$ to $2.99\times10^{-3}$ J/m$^2$). However, even when the exchange coupling constant J is less than $0.8\times10^{-3}$ J/m$^2$, the function of the MR device is not lost.

Although the present invention has been described by the foregoing embodiments and examples (hereinbelow, called embodiments and the like), the invention is not limited to the embodiments and the like but can be variously modified. For example, although a composite thin film magnetic head having both the read head part and the recording head part has been described as an example, alternatively, a read-only thin film magnetic head having only the read head part may be used.

Obviously, many modifications and variations of the present invention are possible in the light of the above teachings. It is therefore to be understood that within the scope of the appended claims the invention may be practiced otherwise than as specifically described.

What is claimed is:

1. A magnetoresistive device comprising:
   a magnetization free layer whose magnetization direction changes according to an external magnetic field;
   a nonmagnetic spacer layer which is in contact with one of faces of the magnetization free layer;
   a synthetic antiferromagnetic pinned layer provided on the side opposite to the magnetization free layer, of the nonmagnetic spacer layer, the synthetic antiferromagnetic pinned layer including, in order from the side of the magnetization free layer, a first magnetization pinned layer whose magnetization direction is pinned in a predetermined direction, a nonmagnetic intermediate layer made of a ruthenium copper alloy (RuCu), and a second magnetization pinned layer whose magnetization direction is pinned opposite to the magnetization direction of the first magnetization pinned layer; and
   a pair of electrode layers provided on both sides, in a stacking direction orthogonal to a stack surface, of a lamination which is configured of the synthetic antiferromagnetic pinned layer, the nonmagnetic spacer layer and the magnetization free layer, the pair of electrode layers providing the lamination with read current in the stacking direction, wherein the first magnetization pinned layer includes a first adjacent layer having a magnetic thickness of 367 kA to 1,312 kA and forming an interface with the nonmagnetic intermediate layer, the second magnetization pinned layer includes a second adjacent layer having a magnetic thickness of 230 kA to 1,175 kA and forming an interface with the nonmagnetic intermediate layer, and the nonmagnetic intermediate layer is made of a ruthenium copper alloy containing ruthenium (Ru) in a range from 60 atom percent (at %) to 85 atom percent (at %).

2. The magnetoresistive device according to claim 1, wherein the first and second adjacent layers are made of a cobalt iron alloy (CoFe) containing cobalt (Co) in a range from 70 atom percent (at %) to 100 atom percent (at %), or made of cobalt.

3. The magnetoresistive device according to claim 1, wherein the nonmagnetic intermediate layer has an exchange coupling constant of $0.8 \times 10^{-3}$ J/m$^2$ or larger and has a thickness of 0.6 nm or more.

4. A thin film magnetic head comprising a magnetoresistive device according to claim 1.

5. A head gimbal assembly comprising:
a magnetic head slider having, on one side thereof, a thin film magnetic head having a magnetoresistive device according to claim 1; and
a suspension whose one end is to be provided with the magnetic head slider.

6. A head arm assembly comprising:
a magnetic head slider having, on one side thereof, a thin film magnetic head having a magnetoresistive device according to claim 1;
a suspension whose one end is to be provided with the magnetic head slider; and
an arm supporting the other end of the suspension.

7. A magnetic disk apparatus comprising a magnetic recording medium and a head arm assembly,
wherein the head arm assembly includes:
a magnetic head slider having, on one side thereof, a thin film magnetic head having a magnetoresistive device according to claim 1;
a suspension whose one end is to be provided with the magnetic head slider; and
an arm supporting the other end of the suspension.

8. A magnetoresistive device comprising:
a magnetization free layer whose magnetization direction changes according to an external magnetic field;
a nonmagnetic spacer layer which is in contact with one of faces of the magnetization free layer;
a synthetic antiferromagnetic pinned layer provided on the side opposite to the magnetization free layer, of the nonmagnetic spacer layer, the synthetic antiferromagnetic pinned layer including, in order from the side of the magnetization free layer, a first magnetization pinned layer whose magnetization direction is pinned in a predetermined direction, a nonmagnetic intermediate layer made of a ruthenium copper alloy (RuCu), and a second magnetization pinned layer whose magnetization direction is pinned opposite to the magnetization direction of the first magnetization pinned layer; and a pair of electrode layers provided on both sides, in a stacking direction orthogonal to a stack surface, of a lamination which is configured of the synthetic antiferromagnetic pinned layer, the nonmagnetic spacer layer and the magnetization free layer, the pair of electrode layers providing the lamination with read current in the stacking direction, wherein the first magnetization pinned layer includes a first adjacent layer having a magnetic thickness of 367 kA to 1,312 kA and forming an interface with the nonmagnetic intermediate layer, the second magnetization pinned layer includes a second adjacent layer having a magnetic thickness of 230 kA to 1,175 kA and forming an interface with the nonmagnetic intermediate layer, and the nonmagnetic intermediate layer is made of a ruthenium copper alloy containing ruthenium (Ru) in a range from 34 atom percent (at %) to 85 atom percent (at %), and has a thickness of 0.6 nm to 1.0 nm.

9. The magnetoresistive device according to claim 8, wherein the nonmagnetic intermediate layer has an exchange coupling constant of $0.8 \times 10^{-3}$ J/m$^2$ or larger 10. A thin film magnetic head comprising a magnetoresistive device according to claim 8.

11. A head gimbal assembly comprising:
a magnetic head slider having, on one side thereof, a thin film magnetic head having a magnetoresistive device according to claim 8; and
a suspension whose one end is to be provided with the magnetic head slider.

12. A head arm assembly comprising:
a magnetic head slider having, on one side thereof, a thin film magnetic head having a magnetoresistive device according to claim 8;
a suspension whose one end is to be provided with the magnetic head slider; and
an arm supporting the other end of the suspension.

13. A magnetic disk apparatus comprising a magnetic recording medium and a head arm assembly,
wherein the head arm assembly includes:
a magnetic head slider having, on one side thereof, a thin film magnetic head having a magnetoresistive device according to claim 8;
a suspension whose one end is to be provided with the magnetic head slider; and
an arm supporting the other end of the suspension.

* * * * *